(12) United States Patent
Howard, Jr. et al.

(10) Patent No.: US 8,617,720 B2
(45) Date of Patent: *Dec. 31, 2013

(54) ELECTROACTIVE COMPOSITION AND ELECTRONIC DEVICE MADE WITH THE COMPOSITION

(75) Inventors: Michael Henry Howard, Jr., Montchanin, DE (US); Nora Sabina Radu, Landenberg, PA (US); Weishi Wu, Landenberg, PA (US); Weiying Gao, Landenberg, PA (US); Norman Herron, Newark, DE (US); Eric Maurice Smith, Hockessin, DE (US); Christina M. Older, Wilmington, DE (US); Adam Fennimore, Wilmington, DE (US); Ying Wang, Wilmington, DE (US); Daniel David Lecloux, Wilmington, DE (US); Kalindi Dogra, Wilmington, DE (US); Vsevolod Rostovtsev, Swarthmore, PA (US); Jerald Feldman, Wilmington, DE (US); Siddhartha Shenoy, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 838 days.

This patent is subject to a terminal disclaimer.

(21) Appl. No.: 12/643,381

(22) Filed: Dec. 21, 2009

(65) Prior Publication Data

US 2011/0147718 A1    Jun. 23, 2011

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 564/26; 564/426; 564/434

(58) Field of Classification Search
USPC ............ 564/26, 426, 434; 313/504, 505, 506; 257/40, E51.05, E51.026, E51.032; 428/690, 917

See application file for complete search history.

(56) References Cited

U.S. PATENT DOCUMENTS

| | | |
|---|---|---|
| 3,846,422 A | 11/1974 | Seltzer et al. |
| 3,849,458 A | 11/1974 | Dinh |
| 4,053,311 A | 10/1977 | Limburg et al. |
| 4,952,667 A | 8/1990 | Shikatani et al. |
| 5,077,142 A | 12/1991 | Sakon et al. |
| 5,116,995 A | 5/1992 | Nakazato et al. |
| 5,247,190 A | 9/1993 | Friend et al. |
| 5,378,519 A | 1/1995 | Kikuchi et al. |
| 5,393,614 A | 2/1995 | Nakada |
| 5,408,109 A | 4/1995 | Heeger et al. |
| 5,487,953 A | 1/1996 | Shirota et al. |
| 5,652,067 A | 7/1997 | Ito et al. |
| 5,707,747 A | 1/1998 | Tomiyama et al. |
| 5,728,801 A | 3/1998 | Wu et al. |
| 5,736,284 A | 4/1998 | Kobayashi et al. |
| 5,792,557 A | 8/1998 | Nakaya et al. |
| 5,817,739 A | 10/1998 | Nukada et al. |
| 5,891,587 A | 4/1999 | Hu et al. |
| 5,929,194 A | 7/1999 | Woo et al. |
| 5,942,648 A | 8/1999 | Coates et al. |
| 5,962,631 A | 10/1999 | Woo et al. |
| 6,005,085 A | 12/1999 | Ueno et al. |
| 6,066,426 A | 5/2000 | Mott et al. |
| 6,140,004 A | 10/2000 | Mott et al. |
| 6,225,467 B1 | 5/2001 | Esteghamatian et al. |
| 6,277,504 B1 | 8/2001 | Koch et al. |
| 6,287,713 B1 | 9/2001 | Heuer et al. |
| 6,294,273 B1 | 9/2001 | Heuer et al. |
| 6,303,238 B1 | 10/2001 | Thompson et al. |
| 6,310,231 B1 | 10/2001 | Igarashi et al. |
| 6,316,130 B1 | 11/2001 | Heuer et al. |
| 6,322,908 B1 | 11/2001 | Oda et al. |
| 6,368,731 B1 | 4/2002 | Heuer et al. |
| 6,451,461 B2 | 9/2002 | Lee et al. |
| 6,503,643 B1 | 1/2003 | Heuer et al. |
| 6,514,968 B1 | 2/2003 | TenBrink |
| 6,524,728 B1 | 2/2003 | Kijima et al. |
| 6,528,657 B2 | 3/2003 | Nakaya et al. |
| 6,534,200 B1 | 3/2003 | Heuer et al. |
| 6,541,128 B2 | 4/2003 | Wehrmann et al. |
| 6,635,364 B1 | 10/2003 | Igarashi |
| 6,646,164 B2 | 11/2003 | Uemura et al. |

| Patent/Publication | Date | Inventors |
|---|---|---|
| 6,657,084 B2 | 12/2003 | Hosokawa et al. |
| 6,670,645 B2 | 12/2003 | Grushin et al. |
| 6,686,067 B2 | 2/2004 | Li et al. |
| 6,800,722 B2 | 10/2004 | Pei |
| 6,830,832 B2 | 12/2004 | Oguma et al. |
| 6,852,355 B2 | 2/2005 | Blanchet-Fincher |
| 6,852,429 B1 | 2/2005 | Li et al. |
| 6,875,523 B2 | 4/2005 | Grushin et al. |
| 6,875,524 B2 | 4/2005 | Hatwar et al. |
| 6,894,129 B2 | 5/2005 | Lee et al. |
| 6,905,785 B2 | 6/2005 | Noguchi et al. |
| 7,023,013 B2 | 4/2006 | Ricks et al. |
| 7,075,102 B2 | 7/2006 | Grushin et al. |
| 7,119,204 B2 | 10/2006 | Lecloux et al. |
| 7,173,131 B2 | 2/2007 | Saitoh et al. |
| 7,186,469 B2 | 3/2007 | Shibanuma et al. |
| 7,189,989 B2 | 3/2007 | Ise |
| 7,351,358 B2 | 4/2008 | Hsu et al. |
| 7,358,409 B2 | 4/2008 | Saitoh et al. |
| 7,365,230 B2 | 4/2008 | Herron et al. |
| 7,375,250 B2 | 5/2008 | Saitoh et al. |
| 7,402,681 B2 | 7/2008 | Ong et al. |
| 7,431,866 B2 | 10/2008 | Hsu et al. |
| 7,462,298 B2 | 12/2008 | Hsu et al. |
| 7,491,450 B2 | 2/2009 | Okinaka et al. |
| 7,528,542 B2 | 5/2009 | Kawamura et al. |
| 7,540,978 B2 | 6/2009 | Pfeiffer et al. |
| 7,586,006 B2 | 9/2009 | Funahashi |
| 7,651,786 B2 | 1/2010 | Matsuura et al. |
| 7,651,788 B2 | 1/2010 | Seo et al. |
| 7,709,104 B2 | 5/2010 | Saitoh et al. |
| 7,745,017 B2 | 6/2010 | Nakamura et al. |
| 7,771,843 B2 | 8/2010 | Suh et al. |
| 7,887,933 B2 | 2/2011 | Kathirgamanathan et al. |
| 8,026,665 B2 | 9/2011 | Kim et al. |
| 8,063,399 B2 | 11/2011 | Johansson et al. |
| 2001/0019782 A1 | 9/2001 | Igarashi et al. |
| 2001/0026878 A1 | 10/2001 | Woo et al. |
| 2002/0048687 A1 | 4/2002 | Hosokawa et al. |
| 2002/0076576 A1 | 6/2002 | Li |
| 2002/0107405 A1 | 8/2002 | Lin et al. |
| 2002/0136924 A1 | 9/2002 | Higashi et al. |
| 2002/0172885 A1 | 11/2002 | Nagai et al. |
| 2002/0182441 A1 | 12/2002 | Lamansky et al. |
| 2003/0022019 A1 | 1/2003 | Seo et al. |
| 2003/0023099 A1 | 1/2003 | Nakaya et al. |
| 2003/0038287 A1 | 2/2003 | Suzuki et al. |
| 2003/0047736 A1 | 3/2003 | Hayashi et al. |
| 2003/0072966 A1 | 4/2003 | Hosokawa et al. |
| 2003/0092880 A1 | 5/2003 | Leclerc et al. |
| 2003/0134140 A1 | 7/2003 | Li |
| 2003/0138657 A1 | 7/2003 | Li |
| 2003/0168970 A1 | 9/2003 | Tominaga et al. |
| 2003/0205696 A1 | 11/2003 | Thoms et al. |
| 2003/0207188 A1 | 11/2003 | Jubran et al. |
| 2003/0214228 A1 | 11/2003 | Itou |
| 2003/0224205 A1 | 12/2003 | Li et al. |
| 2004/0004433 A1 | 1/2004 | Lamansky et al. |
| 2004/0029133 A1 | 2/2004 | Herrnstadt |
| 2004/0038459 A1 | 2/2004 | Brown et al. |
| 2004/0102577 A1 | 5/2004 | Hsu et al. |
| 2004/0106003 A1 | 6/2004 | Chen et al. |
| 2004/0106004 A1 | 6/2004 | Li |
| 2004/0115476 A1 | 6/2004 | Oshiyama et al. |
| 2004/0121184 A1 | 6/2004 | Thompson et al. |
| 2004/0127637 A1 | 7/2004 | Hsu et al. |
| 2004/0170863 A1* | 9/2004 | Kim et al. ............... 428/690 |
| 2004/0188673 A1 | 9/2004 | Grushin et al. |
| 2004/0197601 A1 | 10/2004 | Thompson et al. |
| 2004/0209118 A1 | 10/2004 | Seo et al. |
| 2004/0214034 A1 | 10/2004 | Utsugi et al. |
| 2004/0247936 A1 | 12/2004 | Nakashima et al. |
| 2004/0254297 A1 | 12/2004 | Hsu et al. |
| 2004/0263067 A1 | 12/2004 | Saitoh et al. |
| 2005/0031898 A1 | 2/2005 | Li et al. |
| 2005/0064233 A1 | 3/2005 | Matsuura et al. |
| 2005/0064237 A1 | 3/2005 | Kato et al. |
| 2005/0073249 A1 | 4/2005 | Morii et al. |
| 2005/0074630 A1 | 4/2005 | Kanno et al. |
| 2005/0088083 A1 | 4/2005 | Seo et al. |
| 2005/0106415 A1 | 5/2005 | Jarikov et al. |
| 2005/0158577 A1 | 7/2005 | Ishibashi et al. |
| 2005/0184287 A1 | 8/2005 | Herron et al. |
| 2005/0186106 A1 | 8/2005 | Li et al. |
| 2005/0191776 A1 | 9/2005 | Lamansky et al. |
| 2005/0205860 A1 | 9/2005 | Hsu et al. |
| 2005/0244670 A1 | 11/2005 | Saitoh et al. |
| 2005/0245752 A1 | 11/2005 | Conley et al. |
| 2005/0260448 A1 | 11/2005 | Lin et al. |
| 2006/0003258 A1 | 1/2006 | Vargas et al. |
| 2006/0012312 A1 | 1/2006 | Lyle, Jr. et al. |
| 2006/0017050 A1 | 1/2006 | Hasegawa et al. |
| 2006/0033421 A1 | 2/2006 | Matsuura et al. |
| 2006/0040139 A1 | 2/2006 | Herron et al. |
| 2006/0043858 A1 | 3/2006 | Ikeda et al. |
| 2006/0052641 A1 | 3/2006 | Funahashi |
| 2006/0063852 A1 | 3/2006 | Iwata et al. |
| 2006/0099447 A1 | 5/2006 | Lee et al. |
| 2006/0103298 A1 | 5/2006 | Lee |
| 2006/0113528 A1 | 6/2006 | Okinaka et al. |
| 2006/0115676 A1 | 6/2006 | Igawa et al. |
| 2006/0115678 A1 | 6/2006 | Saitoh et al. |
| 2006/0127698 A1 | 6/2006 | Tokailin et al. |
| 2006/0134459 A1 | 6/2006 | Huo |
| 2006/0134460 A1 | 6/2006 | Kondakova et al. |
| 2006/0134464 A1 | 6/2006 | Nariyuki |
| 2006/0152146 A1 | 7/2006 | Funahashi |
| 2006/0158102 A1 | 7/2006 | Kawamura et al. |
| 2006/0159838 A1 | 7/2006 | Kowalski et al. |
| 2006/0194074 A1 | 8/2006 | Funahashi |
| 2006/0199038 A1 | 9/2006 | Lee |
| 2006/0204784 A1 | 9/2006 | Begley et al. |
| 2006/0210830 A1 | 9/2006 | Funahashi |
| 2006/0216411 A1 | 9/2006 | Steudel et al. |
| 2006/0217572 A1 | 9/2006 | Kawamura et al. |
| 2006/0263631 A1 | 11/2006 | Lee et al. |
| 2006/0267488 A1 | 11/2006 | Saitoh et al. |
| 2006/0284140 A1 | 12/2006 | Breuning et al. |
| 2007/0026257 A1 | 2/2007 | Begley et al. |
| 2007/0031701 A1 | 2/2007 | Nakashima et al. |
| 2007/0037983 A1 | 2/2007 | Nomura et al. |
| 2007/0063638 A1 | 3/2007 | Tokairin et al. |
| 2007/0079927 A1 | 4/2007 | Lamansky et al. |
| 2007/0088185 A1 | 4/2007 | Kubota et al. |
| 2007/0096082 A1 | 5/2007 | Gaynor et al. |
| 2007/0099024 A1 | 5/2007 | Nii et al. |
| 2007/0114917 A1 | 5/2007 | Funahashi |
| 2007/0134511 A1 | 6/2007 | Kawamura et al. |
| 2007/0155991 A1* | 7/2007 | Funahashi ............... 564/426 |
| 2007/0176544 A1 | 8/2007 | Koike et al. |
| 2007/0182321 A1 | 8/2007 | Kinoshita et al. |
| 2007/0228364 A1 | 10/2007 | Radu et al. |
| 2007/0236137 A1 | 10/2007 | Funahashi |
| 2007/0247063 A1 | 10/2007 | Murase et al. |
| 2007/0255076 A1 | 11/2007 | Ito et al. |
| 2007/0285009 A1 | 12/2007 | Kubota |
| 2007/0292713 A9 | 12/2007 | Dobbs et al. |
| 2007/0298530 A1 | 12/2007 | Feehery |
| 2008/0023676 A1 | 1/2008 | Hsu |
| 2008/0049413 A1 | 2/2008 | Jinde et al. |
| 2008/0067473 A1 | 3/2008 | Walker et al. |
| 2008/0071049 A1 | 3/2008 | Radu et al. |
| 2008/0086012 A1 | 4/2008 | Egawa et al. |
| 2008/0097076 A1 | 4/2008 | Radu et al. |
| 2008/0102312 A1 | 5/2008 | Parham et al. |
| 2008/0111473 A1 | 5/2008 | Kawamura et al. |
| 2008/0114178 A1 | 5/2008 | Kawakami et al. |
| 2008/0138655 A1 | 6/2008 | Lecloux et al. |
| 2008/0191614 A1* | 8/2008 | Kim et al. ............... 313/504 |
| 2008/0233433 A1 | 9/2008 | Igarashi et al. |
| 2008/0286605 A1 | 11/2008 | Takeda |
| 2008/0303425 A1 | 12/2008 | Rostovtsev et al. |
| 2008/0303428 A1 | 12/2008 | Rostovtsev et al. |
| 2008/0315753 A1 | 12/2008 | Liao et al. |
| 2008/0315754 A1 | 12/2008 | Kawamura et al. |
| 2009/0001327 A1 | 1/2009 | Werner et al. |
| 2009/0051281 A1 | 2/2009 | Inoue |
| 2009/0058279 A1 | 3/2009 | Takeda |

| | | | |
|---|---|---|---|
| 2009/0134781 A1 | 5/2009 | Jang et al. | |
| 2009/0162644 A1 | 6/2009 | Ricks et al. | |
| 2009/0184635 A1 | 7/2009 | Pan et al. | |
| 2009/0206327 A1 | 8/2009 | Radu et al. | |
| 2009/0206748 A1 | 8/2009 | Moriwaki et al. | |
| 2009/0242877 A1 | 10/2009 | Kondakov | |
| 2009/0295274 A1 | 12/2009 | Hwang et al. | |
| 2010/0108989 A1 | 5/2010 | Büsing et al. | |
| 2010/0187505 A1 | 7/2010 | Stoessel et al. | |
| 2010/0187977 A1 | 7/2010 | Kai et al. | |
| 2011/0101312 A1 | 5/2011 | LeCloux et al. | |
| 2011/0147718 A1 | 6/2011 | Howard, Jr. et al. | |

FOREIGN PATENT DOCUMENTS

| | | |
|---|---|---|
| CN | 1668719 A | 9/2005 |
| CN | 1711334 A | 12/2005 |
| CN | 1768029 A | 5/2006 |
| CN | 1957646 A | 5/2007 |
| CN | 101255172 A | 9/2008 |
| DE | 102004020046 A1 | 7/2005 |
| EP | 341859 A1 | 11/1989 |
| EP | 525904 A1 | 12/1994 |
| EP | 498979 A1 | 1/1995 |
| EP | 443861 A2 | 7/1995 |
| EP | 390551 A2 | 7/1996 |
| EP | 564224 A2 | 5/1997 |
| EP | 650955 A1 | 8/1998 |
| EP | 681019 A2 | 9/1999 |
| EP | 992564 A1 | 4/2000 |
| EP | 1061112 A1 | 12/2000 |
| EP | 1097981 A2 | 5/2001 |
| EP | 1191612 A2 | 3/2002 |
| EP | 1191614 A2 | 3/2002 |
| EP | 1215945 A2 | 6/2002 |
| EP | 1227529 A2 | 7/2002 |
| EP | 765106 A2 | 11/2002 |
| EP | 1277824 A1 | 1/2003 |
| EP | 1317005 A2 | 6/2003 |
| EP | 1394617 A2 | 3/2004 |
| EP | 1398340 A1 | 3/2004 |
| EP | 1414081 A2 | 4/2004 |
| EP | 1424381 A2 | 6/2004 |
| EP | 1541657 A1 | 6/2005 |
| EP | 1561794 A1 | 8/2005 |
| EP | 1586616 A2 | 10/2005 |
| EP | 1612202 A1 | 1/2006 |
| EP | 1624500 A1 | 2/2006 |
| EP | 1718121 A1 | 11/2006 |
| EP | 1718124 A1 | 11/2006 |
| EP | 1724323 A1 | 11/2006 |
| EP | 1786050 A1 | 5/2007 |
| EP | 1792893 A1 | 6/2007 |
| EP | 1820801 A1 | 8/2007 |
| EP | 1860096 A1 | 11/2007 |
| EP | 1932895 A1 | 6/2008 |
| EP | 1995292 A1 | 11/2008 |
| EP | 2067766 A1 | 6/2009 |
| EP | 2067767 A1 | 6/2009 |
| EP | 2080762 A1 | 7/2009 |
| EP | 2085450 A1 | 8/2009 |
| EP | 2093271 A1 | 8/2009 |
| EP | 2161272 A1 | 3/2010 |
| EP | 2189508 A2 | 5/2010 |
| JP | 61041152 A | 2/1986 |
| JP | 05214332 A | 8/1993 |
| JP | 07048385 A | 2/1995 |
| JP | 07249490 A | 9/1995 |
| JP | 08053397 A | 2/1996 |
| JP | 08099941 A | 4/1996 |
| JP | 08259934 A | 10/1996 |
| JP | 09031454 A | 2/1997 |
| JP | 10284252 A | 10/1998 |
| JP | 11040355 A | 2/1999 |
| JP | 11067449 A | 3/1999 |
| JP | 11121179 A | 4/1999 |
| JP | 11224779 A | 8/1999 |
| JP | 11327181 A | 11/1999 |
| JP | 2000186066 A | 7/2000 |
| JP | 2004010550 A | 1/2001 |
| JP | 2001039933 A | 2/2001 |
| JP | 2001110572 A | 4/2001 |
| JP | 2001226331 A | 8/2001 |
| JP | 2001267080 A | 9/2001 |
| JP | 2001520450 A | 10/2001 |
| JP | 2002531467 A | 9/2002 |
| JP | 2002352961 A | 12/2002 |
| JP | 2003026688 A | 1/2003 |
| JP | 2003031371 A | 1/2003 |
| JP | 2003229279 A | 8/2003 |
| JP | 2003238501 A | 8/2003 |
| JP | 2003253001 A | 9/2003 |
| JP | 2004506305 A | 2/2004 |
| JP | 2004109999 A | 4/2004 |
| JP | 2004176024 A | 6/2004 |
| JP | 2004184569 A | 7/2004 |
| JP | 2004185883 A | 7/2004 |
| JP | 2004220931 A | 8/2004 |
| JP | 2004359671 A | 12/2004 |
| JP | 2004536124 A | 12/2004 |
| JP | 2005108804 A | 4/2005 |
| JP | 2006016384 A | 1/2006 |
| JP | 2006052323 A | 2/2006 |
| JP | 2006135315 A | 5/2006 |
| JP | 2006151844 A | 6/2006 |
| JP | 2006129392 A | 8/2006 |
| JP | 20062193392 A | 8/2006 |
| JP | 2007182432 A | 7/2007 |
| JP | 2007186449 A | 7/2007 |
| JP | 2009021336 A | 1/2009 |
| JP | 2009161470 A | 7/2009 |
| KR | 1020090046731 A | 5/2009 |
| KR | 1020090086015 A | 8/2009 |
| KR | 1020090086920 A | 8/2009 |
| KR | 1020090093897 A | 9/2009 |
| WO | 9920081 A2 | 4/1999 |
| WO | 9952992 A1 | 10/1999 |
| WO | 9954385 A1 | 10/1999 |
| WO | 0032717 A1 | 6/2000 |
| WO | 0053565 A1 | 9/2000 |
| WO | 0055927 A1 | 9/2000 |
| WO | 0070655 A2 | 11/2000 |
| WO | 0141512 A1 | 6/2001 |
| WO | 0202714 A2 | 1/2002 |
| WO | 0215645 A1 | 2/2002 |
| WO | 0230159 A1 | 4/2002 |
| WO | 0243449 A1 | 5/2002 |
| WO | 03008424 A1 | 1/2003 |
| WO | 03040257 A1 | 5/2003 |
| WO | 03057762 A1 | 7/2003 |
| WO | 03063555 A1 | 7/2003 |
| WO | 03078541 A1 | 9/2003 |
| WO | 03079737 A2 | 9/2003 |
| WO | 03080760 A1 | 10/2003 |
| WO | 03080761 A1 | 10/2003 |
| WO | 03088271 A1 | 10/2003 |
| WO | 03091688 A2 | 11/2003 |
| WO | 2004016710 A1 | 2/2004 |
| WO | 2004018587 A1 | 3/2004 |
| WO | 2004025748 A1 | 3/2004 |
| WO | 2004046275 A1 | 6/2004 |
| WO | 2004074339 A1 | 9/2004 |
| WO | 2004077885 A2 | 9/2004 |
| WO | 2004093208 A1 | 10/2004 |
| WO | 2004106409 A1 | 12/2004 |
| WO | 2005000787 A1 | 1/2005 |
| WO | 2005014551 A1 | 2/2005 |
| WO | 2005049546 A1 | 6/2005 |
| WO | 2005049548 A1 | 6/2005 |
| WO | 2005049689 A2 | 6/2005 |
| WO | 2005052027 A1 | 6/2005 |
| WO | 2005080525 A2 | 9/2005 |
| WO | 2005089025 A1 | 9/2005 |
| WO | 2006011090 A1 | 2/2006 |
| WO | 2006025273 A1 | 3/2006 |
| WO | 2006043087 A1 | 4/2006 |
| WO | 2006063852 A1 | 6/2006 |
| WO | 2006072002 A2 | 7/2006 |

| | | | |
|---|---|---|---|
| WO | 2006072015 A2 | 7/2006 | |
| WO | 2006086684 A1 | 8/2006 | |
| WO | 2006112582 A1 | 10/2006 | |
| WO | 2006121237 A | 11/2006 | |
| WO | 2007021117 A1 | 2/2007 | |
| WO | 2007065678 A1 | 6/2007 | |
| WO | 2007076146 A2 | 7/2007 | |
| WO | 2007079103 A2 | 7/2007 | |
| WO | 2007100096 A1 | 9/2007 | |
| WO | 2007105917 A | 9/2007 | |
| WO | 2007108666 A | 9/2007 | |
| WO | 2007145979 A2 | 12/2007 | |
| WO | 2008011953 A1 | 1/2008 | |
| WO | 2008025997 A1 | 3/2008 | |
| WO | 2008147721 A1 | 12/2008 | |
| WO | 2008149968 A1 | 12/2008 | |
| WO | WO 2008/149968 | * 12/2008 | |
| WO | 2009018009 A1 | 2/2009 | |
| WO | 2009028902 A2 | 3/2009 | |
| WO | 2009055628 A1 | 4/2009 | |
| WO | 2009067419 A1 | 5/2009 | |
| WO | 2009069790 A1 | 6/2009 | |
| WO | 2009136596 A1 | 11/2009 | |
| WO | 2010021524 A2 | 2/2010 | |
| WO | 2010064627 A1 | 6/2010 | |
| WO | 2010068865 A2 | 6/2010 | |
| WO | 2010071362 A2 | 6/2010 | |
| WO | 2010098246 A1 | 9/2010 | |
| WO | 2010099534 A2 | 9/2010 | |
| WO | 2010135403 A2 | 11/2010 | |
| WO | 2011053334 A1 | 5/2011 | |
| WO | 2011159872 A1 | 12/2011 | |

OTHER PUBLICATIONS

International Search Report, Korean Intellectual Property Office, International Application No. PCT/US2010/061672, mailed Sep. 26, 2011.
Rehahn, Matthias et al, "Synthesis, solution properties and conversion of poly(2,9-o-phenanthroline-alt-(2'5'-dihexyl)-4,4"-p-terphenylene)s into soluble, well-defined copper(I) and silver (I) complex polymers," Macromol. Chem. Phys., 1998, 127-140, 199, Huthig & Wepf Verlag, Zug.
Robertson et al., "Preparation on, X-ray Structure and Properties of a Hexabrominated, Symmetric Indole Trimer and its TCNQ Adduct: A New Route to Functional Molecular Systems," Journal of Materials Chemistry, 2000, vol. 10, pp. 2043-2047.
Sajiki et al., "Efficient C-H/C-D Exhange Reaction on the Alkyl Side Chain of Aromatic Compounds Using Heterogenous Pd/C in D2O," Organic Letters, 2004, vol. 6, No. 9, pp. 1485-1487.
Stille, "The Palladium-Catalyzed Cross-Coupling Reactions of Organotin Reagents with Organic Electrophiles," Angew. Chem. Int. Ed. Engl., 1986, vol. 25, pp. 508-524.
Sun et al., "PVC membrane lithium-selective electrodes based on oligomethylene-bridged bis-1,10-phenanthroline derivatives," Analytica Chimica Acta, 1996, 57-64, 329, Elsevier Science B.V.
Sze, "Thin-Film Transistor," Physics of Semiconductor Devices, 2nd Edition (John Wiley and Sons), pp. 492-493.
Tokito et al., "Highly Efficient Blue-Green Emission from Organic Light-Emitting Diodes Using Dibenzochrysene Derivatives," Applied Physics Letters, 2000, vol. 77, No. 2, pp. 160-162.
Tong et al., "Enhancement of OLED Efficiencies and High-Voltage Stabilities of Light-Emitting Materials by Deuteration," Journal of Physical Chemistry, 2007, vol. 111, pp. 3490-3494.
Wang et al., "Novel bis(8-hydroxyquinoline)phenolate-aluminum Complexes for Organic Light-emitting Diodes," Synthetic Metals, 2002, vol. 131, 1-3, pp. 1-5.
Wang, "Photoconductive Materials," Kirk-Othmer Encyclopedia of Chemical Technology, Fourth Edition, 1996, vol. 18, pp. 837-860.
Watts et al., "A Novel Deuterium Effect of Dual Charge-Transfer and Ligand-Field Emission of the cis-Dichlorobis (2,2'-bipyridine)iridium(III) Ion," Journal of the American Chemical Society, 1979, vol. 101(10), pp. 2742-2743.
Weine et al., "Reactions of an O-Quinone Monoimide with Anthracenes, Phencyclone, and 1,3-Diphenylisobenzofuran," Journal of Organic Chemistry, 1989, vol. 54, pp. 5926-5930.
Wolfe et al., "Rational Development fo Practical Catalysts for Aromatic Carbon-Nitrogen Bond Formation," Accounts of Chemical Research, 1998, vol. 31, No. 12, pp. 805-818.
Yamada et al., Synthesis of 2,9-Dichloro-1,10-phenanthroline from N,N'-Annelated Phenanthrolinediones, Bulletin of the Chemical Society of Japan, 1990, vol. 63, No. 9, pp. 2710-2712.
Yamamoto et al., "Electrically conducting and thermally stable □-conjugated poly(arylene)s prepared by organometallic process," Progress in Polymer Science, 1992, vol. 17, pp. 1153-1205.
Yamamoto et al., "Preparation and Properties of □-Conjugated Poly(1,10-phenanthroline03,8-diyl)," Chemistry Letters, 1995, pp. 785-786.
Yamamoto et al., "Preparation of New Electron-Accepting -Conjugated Polyquinoxalines. Chemical and Electrochemical Reduction, Electrically Conducting Properties, and Use in Light-Emitting Diodes," J. Am. Chem. Soc., 1996, vol. 118, pp. 3930-3937.
Yang et al., "Palladium-Catalyzed Amination of Aryl Halides and Sulfonates," Journal of Organometallic Chemistry, 1999, 576, pp. 125-146.
Zhu et al., "An Improved Preparation of Arylboronates: Application in One-Pot Suzuki Biaryl Synthesis," Journal of Organic Chemistry, 2003, vol. 68, pp. 3729-3732.
Zhu et al., "Effect of ITO Carrier Concentration on the Performance of Light-Emitting Diodes," 2000; Material Research Society; Chem Abstract 134: 122994.
Zotti et al., "Electrochemical, Conductive and Magnetic Properties of 2,7-Carbazole-based Conjugated Polymers," Macromolecules, 2002, vol. 35, pp. 2122-2128.
Extended European Search Report for Application No. EP 09844464.9, counterpart to U.S. Appl. No. 12/643,511; Oct. 26, 2012.
Extended European Search Report for Application No. EP 09848342.3, counterpart to U.S. Appl. No. 12/643,487; Jan. 26, 2013.
International Search Report for Application No. PCT/US2009/067669, counterpart to U.S. Appl. No. 12/635,909; Oh Hyun Shik, Authorized Officer; KIPO; Jul. 14, 2010.
International Search Report for Application No. PCT/US10/035364, PCT counterpart of U.S. Appl. No. 13/265,025; Hyun Shik Oh, Authorized Officer; KIPO; Dec. 24, 2010.
International Search Report for Application No. PCT/2009/068928, counterpart to U.S. Appl. No. 12/643,511, Oh Hyun Shik, Authorized Officer; KIPO; Aug. 17, 2010.
International Search Report for Application No. PCT/2009/068956, counterpart to U.S. Appl. No. 12/643,487, Oh Hyun Shik, Authorized Officer; KIPO; Sep. 6, 2010.
International Search Report for Application No. PCT/2010/040578, counterpart to U.S. Appl. No. 13/379,807; Oh Hyun Shik, Authorized Officer; KIPO; Feb. 11, 2011.
Abdul-Rahman et al., "Dinuclear molybdenum complexes derived from diphenols: electrochemical interactions and reduced species," Polyhedron, 1997, vol. 16, No. 24, pp. 4353-4362.
Beckmann et al., "Methyl Reorientation in Solid 3-ethychrysene and 3-isopropylesene; Solid State Nuclear Magnetic Resonance," 1998; vol. 12; pp. 251-256.
Boix et al., "Efficient H-D Exchange of Aromatic Compounds in Near-Critical D20 Catalyzed by a Polymer-Supported Sulphonic Acid," Tetrahedron Letters, 1999, vol. 40, pp. 4433-4436.
Buchwald et al., "Industrial-Scale Palladium-Catalyzed Coupling of Aryl Halides and Amines—A Personal Account," Advanced Synthesis & Catalysis, 2006, vol. 348, pp. 23-39.
Byung Doo Chin et al: "Improved blue light-emitting polymeric device by the tuning of drift mobility and charge balance" Applied Physics Letters, 2004, vol. 84, No. 10, pp. 1777-1779, XP002608479.
Campbell, I.H. et al., "Excitation Transfer Processes in a Phosphor-Doped Poly(p-phenylene vinylene) Light-Emitting Diode," Physical Review B., vol. 65, 085210-1-085210-8.
Carey et al., Structure and Mechanisms; Advanced Organic Chemistry, Part A, 5th Edition, pp. 142-145.
Chai et al., "5-Coordinated Aluminum Complexes Having Two 2,4-dimethyl-8-hydroxylquinoline Ligands and a Phenolic Ligand as Possible Materials for White Emission Organice Light-Emitting Devices," Thin Solid Films, Elsevier-Sequoia SA, Lausanne, CH; vol. 479, No. 1-2, May 23, 2005, pp. 282-287.

Chebaane et al., No. 473: Synthese d'Aryl-2 Naphtalenes et de Dibenzocoumarines. 2e Partie: Aromatisation par le Palladium/Charbon des Tetrahydrodibenzocoumarines: Synthese d'Aryl-2-naphtalenes et de dibenzocoumarines, Bulletin de la Societe Chimique de France, Nov.-Dec. 1975, pp. 2521-2526.

Chen et al., "Efficient, Blue Light-Emitting Diodes Using Cross-Linked Layers of Polymeric Arylamine and Fluorene," Synthetic Metals, 1999, vol. 107, pp. 129-135.

Colon et al., "High Molecular Weight Aromatic Polymers by Nickel Coupling of Aryl Polychlorides," Journal of Polymer Science, Part A, Polymer Chemistry Edition, 1990, vol. 28, pp. 367-383.

Danel et al., "Blue-Emitting Anthracenes with End-Capping Diarylamines," Chem. Mater., 2002, vol. 14, pp. 3860-3865.

Desarbre et al., "Synthesis of Symmetric and Non-Symmetric Indolo[2,3-c]carbazole Derivatives: Preparation of Indolo[2,3-c]pyrrolo[3,4-a]carbazoles," Journal of the Chemical Society, Perkin Transactions 1: Organic and Bio-Organic Chemistry, 1998, vol. 13, pp. 2009-2016.

Dietrich-Buchecker et al., "Direct Synthesis of Disubstituted Aromatic Polyimine Chelates," Tetrahedron Letters, 1982, vol. 23 (50), pp. 5291-5294.

Dietrich-Buchecker et al., "Selective and efficient synthesis of di-, tri- and tetrasubstituted 1,10-phenanthrolines," Tetrahedron Letters, 1999, 3395-3396, 40, Elsevier Science Ltd.

Eaton et al., "Dihedral Angle of Biphenyl in Solution and the Molecular Force Field," J. Chem. Soc. Faraday Trans. 2, 1973, 60 pp. 1601-1608.

Esaki et al., "Efficient H/D Exchange Reactions of Alkyl-Substituted Benzene Derivatives by Means of the Pd/C—H—D2O System," Chemistry: A European Journal, 2007, vol. 13, pp. 4052-4063.

Fang et al., "New Alternative Copolymer Constituted of Fluorene and Triphenylamine Units with a Tunable -CHO Group in the Side Chain," Macromolecules, vol. 37, 2004, pp. 5894-5899.

Ge et al., "Novel Bipolar Bathophenanthroline Containing Hosts for Highly Efficient Phosphorescent OLEDs," Organic Letters, 2008, vol. 10, No. 3, pp. 421-424.

Giebeler et al., "The photovoltaic effect in poly(p-phenylene-2,3'-bis(3,2'-diphenyl)-quinoxaline-7-7'-diyl)," Optical Materials, Jan. 1998, 99-103, 9, Elsevier Science B.V.

Guo et al., "Aromatic H/D Exchange Reaction Catalyzed by Groups 5 and 6 Metal Chlorides," Chinese Journal of Chemistry, 2005, vol. 23, pp. 341-344.

Gustafsson et al., "Flexible Light-Emitting Diodes Made From Soluble Conducting Polymers," Nature, 1992, vol. 357, pp. 477-479.

Hartwig, "Carbon-Heteroatom Bond Formation Catalyzed by Organometallic Complexes," Nature, 2008 vol. 455, No. 18, pp. 314-322.

Hartwig, "Discovery and Understanding of Transition-Metal-Catalyzed Aromatic Substitution Reactions," Syn Lett., 2006, No. 9, pp. 1283-1294.

He et al., "A Hole-transporting material with Contollable Morphology Containing Binaphthyl and Triphenylamine Chromophores," Advanced Functional Materials, 2006, vol. 16, No. 10, pp. 1343-1348.

He et al., "High-Efficiency Organic Polymer Light-Emitting Heterostructure Devices on Flexible Plastic Substrates," Applied Physics Letters, 2000, vol. 76, No. 6, pp. 661-663.

Hino et al., "Efficient Low-Molecule Phosphorescent Organic Light-Emitting Diodes Fabricated by Wet-Processing," Organic Electronics, vol. 5, No. 5, Sep. 2004, pp. 265-270.

Ishiyama et al., "Palladium(0)-Catalyzed Cross-Coupling Reaction of Alkoxydiboron with Haloarenes: A Direct Procedure for Arylboronic Esters," Journal of Organic Chemistry, 1995, vol. 60, pp. 7508-7510.

Itano et al., "Fabrication and Performances of a Double-Layer Organic Electroluminescent Device Using a Novel Starburst Molecule, 1,3,5-Tris[N-(4-diphenylaminophenyl)phenylamino]benzene, as a Hole-Transport Material and Tris (8-quinolinolato)aluminum as an Emitting Material," IEEE Transactions on Electron Devices, vol. 44, No. 8, Aug. 1, 1997, pp. 1218-1221.

Janosik et al., "Reactions of 2,3'-biindolyl: Synthesis of Indolo[3,2-a]Carbazoles," Tetrahedron, 1999, vol. 55, p. 2371-2380.

Jin et al., "Blue electroluminescence in blend of polymers containing carbazole and 1,3,4-oxadiazole units," Thin Solid Films, 2000, 255-258, 363, Elsevier Science S.A.

Kang et al., "Silane- and Triazine-containing Hole and Exciton Blocking Material for High-Efficiency Phosphorescent Organic Light-Emitting Diodes," Journal of Materials Chemistry, 2007, vol. 17, No. 35, pp. 3714-3719.

Kim et al., "Synthesis and Electroluminescent Properties of Highly Efficient Anthracene Derivatives with Bulky Side Groups," Organic Electronics, 2009, vol. 10, No. 5, pp. 822-833.

Klaerner et al., "Cross-Linkable Polymers Based on Dialkylfluorenes," Chemistry of Materials, 1999, 11, pp. 1800-1805.

Knolker et al., "Iron-Mediated Synthesis of Indolo[2,3-b]Carbazole," Tetrahedron Letters, 1998, vol. 39, No. 23, pp. 4007-4008.

Kodomari et al., "Selective Halogenation of Aromatic Hydrocarbons with Alumina-Supported Copper (III) Halides," Journal of Organic Chemistry,1988, vol. 53, p. 2093-2094.

Kumada, "Nickel and Palladium Complex Catalyzed Cross-Coupling Reactions of Organometallic Reagents with Organic Halides," Pure & Applied Chemistry, 1980, vol. 52, pp. 669-679.

Leznoff et al "Photocyclization of Aryl Polyenes. V. Photochemical Synthesis of Substituted Chrysenes," Canadian Journal of Chemistry, 1972, vol. 50, pp. 528-533.

Limburg et al., "Electronic Transport Properties of Molecularly Doped Polymers—Some Substituted Triarylmethanes," Organic Coatings and Plastics, Chemistry, 1978, 534-539, 38.

Markus et al—Electronics and Nuleonics Dictionary, pp. 470-471 & 476 (McGraw-Hill 1966).

Mueller et al., "Synthesis and Characterization of Soluble Oligo(9,10-anthrylene)s," Chemische Berichte, 1994, 127, pp. 437-444.

Murata et al., "Novel Palladium(0)-Catalyzed Coupling Reaction of Dialkoxyborane with Aryl Halides: A Convenient Synthetic Route to Arylboronates," Journal of Organic Chemistry, 1997, vol. 62, pp. 6458-6459.

Murata et al., "Palladium-Catalyzed Borylation of Aryl Halides or Triflates with Dialkoxyborane: A Novel and Facile Synthetic Route to Aryboronates," Journal of Organic Chemistry, 2000, vol. 65, No. 1,pp. 164-168.

Nair et al., "An Efficient Synthesis of Indolo[3,2-a]carbazoles via the Novel Acid Catalyzed Reaction of Indoles and Diaryl-1,2-diones," Organic & Biomolecular Chemistry, 2008, vol. 6, pp. 1738-1742.

Negishi et al; III.2.15 Palladium Catalyzed Conjugate Substitution; Handbook of Organopalladium Chemistry for Organic Synthesis, 2000, vol. 1, pp. 767-789.

Negishi, "Palladium- or Nickel-Catalyzed Cross Coupling. A New Selective Method for Carbon-Carbon Bond Formation,"Accounts of Chemical Research, 1982, vol. 15, pp. 340-348.

O'Brien et al., "Use of poly(phenyl quinoxaline) as an electron transport material in polymer light-emitting diodes," Applield Physics Letters, 1996, 69(7), pp. 881-883, American Institute of Physics.

O'Brien, D.F. et al., "Electrophosphorescence From a Doped Polymer Light Emitting Diode," Synthetic Metals, 2001, 116(1-3), pp. 379-383.

Pindur et al., "Indolo[3,2-b]carbazol: Reaktionsprodukt der Umsetzung von 3,3'-Bisindolylmethan mit Orthoameisensauretriethylester," Archiv der Pharmazie, 1987, vol. 320, pp. 280-282.

Rawlins et al., "A Tungsten Organometallic Complex as a Spectroscopic Probe of Acrylate Polymerization in the Films," Polymer Preprints, 1996, pp. 647-648.

* cited by examiner

*Primary Examiner* — Gregory Clark

(57) ABSTRACT

There is provided an electroactive composition including: a deuterated first host material and an electroluminescent dopant material. The first host is a compound having Formula I:

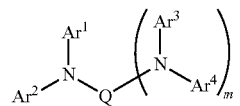

The compound of Formula I is deuterated. In Formula I: $Ar^1$ to $Ar^4$ are the same or different and are aryl; Q is a multivalent aryl group or

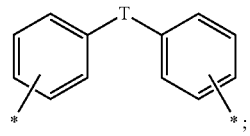

where T is $(CR')_a$, $SiR_2$, S, $SO_2$, PR, PO, $PO_2$, BR, or R; R is the same or different at each occurrence and is an alkyl group or an ary group; R' is the same or different at each occurrence and is selected H, D, or alkyl; a is an integer from 1-6; and m is an integer from 0-6.

9 Claims, 2 Drawing Sheets

ELECTROACTIVE COMPOSITION AND ELECTRONIC DEVICE MADE WITH THE COMPOSITION

BACKGROUND INFORMATION

1. Field of the Disclosure

This disclosure relates in general to electroactive compositions that are useful in organic electronic devices.

2. Description of the Related Art

In organic electroactive electronic devices, such as organic light emitting diodes ("OLED"), that make up OLED displays, the organic active layer is sandwiched between two electrical contact layers in an OLED display. In an OLED, the organic electroactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used.

Devices that use electroactive materials frequently include one or more charge transport layers, which are positioned between an electroactive (e.g., light-emitting) layer and a contact layer (hole-injecting contact layer). A device can contain two or more contact layers. A hole transport layer can be positioned between the electroactive layer and the hole-injecting contact layer. The hole-injecting contact layer may also be called the anode. An electron transport layer can be positioned between the electroactive layer and the electron-injecting contact layer. The electron-injecting contact layer may also be called the cathode. Charge transport materials can also be used as hosts in combination with the electroactive materials.

There is a continuing need for new materials and compositions for electronic devices.

SUMMARY

There is provided an electroactive composition comprising a deuterated first host material and an electroluminescent dopant material, wherein the deuterated first host material is a compound having Formula I:

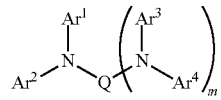

where:
Ar$^1$ to Ar$^4$ are the same or different and are aryl;
Q is selected from the group consisting of multivalent aryl groups, and

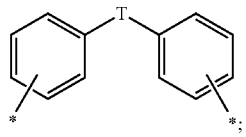

T is selected from the group consisting of $(CR')_a$, $SiR_2$, S, $SO_2$, PR, PO, $PO_2$, BR, and R;
R is the same or different at each occurrence and is selected from the group consisting of alkyl, and aryl;
R' is the same or different at each occurrence and is selected from the group consisting of H, D, and alkyl;
a is an integer from 1-6; and
m is an integer from 0-6;
wherein the compound is deuterated.

There is also provided the above electroactive composition which further comprises a second host material.

There is also provided an organic electronic device comprising two electrical contact layers with an organic electroactive layer therebetween, wherein the electroactive layer comprises the electroactive composition described above.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
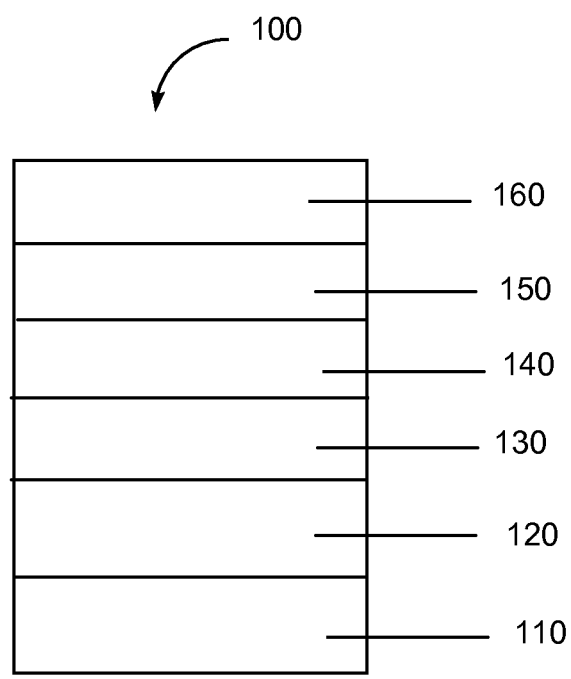
FIG. 1 includes an illustration of an exemplary organic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Electroactive Composition, the Electronic Device, and finally Examples.

1. Definitions and Clarification of Terms

Before addressing details of embodiments described below, some terms are defined or clarified.

The term "alkyl" is intended to mean a group derived from an aliphatic hydrocarbon. In some embodiments, the alkyl group has from 1-20 carbon atoms.

The term "aryl" is intended to mean a group derived from an aromatic hydrocarbon. The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like. In some embodiments, the aryl group has from 4-30 carbon atoms.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport material facilitate negative charge. Although light-emitting materials may also have some charge transport properties, the term "charge transport layer, material, member, or structure" is not intended to include a layer, material, member, or structure whose primary function is light emission.

The term "deuterated" is intended to mean that at least one H has been replaced by D. The term "deuterated analog" refers to a structural analog of a compound or group in which one or more available hydrogens have been replaced with deuterium. In a deuterated compound or deuterated analog, the deuterium is present in at least 100 times the natural abundance level.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "electroluminescence" refers to the emission of light from a material in response to an electric current passed through it. "Electroluminescent" refers to a material that is capable of electroluminescence.

The term "emission maximum" is intended to mean the highest intensity of radiation emitted. The emission maximum has a corresponding wavelength.

The term "fused aryl" refers to an aryl group having two or more fused aromatic rings.

The term "HOMO" refers to the highest occupied molecular orbital. The HOMO energy level is measured relative to vacuum level, as illustrated in FIG. 1A. By convention, the HOMO is given as a negative value, i.e. the vacuum level is set as zero and the bound electron energy levels are deeper than this. By "shallower" it is meant that the level is closer to the vacuum level. This is illustrated in FIG. 1B, where HOMO B is shallower than HOMO A.

The term "host material" is intended to mean a material, usually in the form of a layer, to which a dopant may or may not be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "LUMO" refers to the lowest unoccupied molecular orbital. The LUMO energy level is measured relative to vacuum level in eV, as illustrated in FIG. 1A. By convention, the LUMO is a negative value, i.e. the vacuum level is set as zero and the bound electron energy levels are deeper than this. A "deeper" level is farther removed from vacuum level. This is illustrated in FIG. 1B, where LUMO B is deeper than LUMO A.

The term "organic electronic device," or sometimes just "electronic device," is intended to mean a device including one or more organic semiconductor layers or materials.

The term "silyl" refers to the group —$SiR_3$, where R is the same or different at each occurrence and is selected from the group consisting of alkyl groups, and aryl groups.

The term "Tg" refers to the glass transition temperature of a material.

The term "triplet energy" refers to the lowest excited triplet state of a material, in eV. Triplet energies are reported as positive numbers and represent the energy of the triplet state above the ground state, usually a singlet state.

Unless otherwise indicated, all groups can be unsubstituted or substituted. Unless otherwise indicated, all groups can be linear, branched or cyclic, where possible. In some embodiments, the substituents are selected from the group consisting of alkyl, alkoxy, aryl, and silyl.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Electroactive Composition

The electroactive compositions described herein comprise: a deuterated first host material and an electroluminescent dopant material, wherein the deuterated first host material is a compound having Formula I:

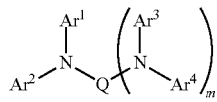

where:
Ar¹ to Ar⁴ are the same or different and are aryl;
Q is selected from the group consisting of multivalent aryl groups, and

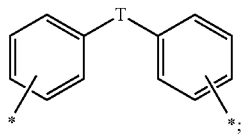

T is selected from the group consisting of $(CR')_a$, $SiR_2$, S, $SO_2$, PR, PO, $PO_2$, BR, and R;
R is the same or different at each occurrence and is selected from the group consisting of alkyl, and aryl;
R' is the same or different at each occurrence and is selected from the group consisting of H, D, and alkyl;
a is an integer from 1-6; and
m is an integer from 0-6;
wherein the compound is deuterated.

In some embodiments, the deuterated host material has a solubility in toluene of at least 0.6 wt %. In some embodiments, the solubility in toluene is at least 1 wt %.

In some embodiments, the deuterated first host material has a Tg greater than 95°.

In some embodiments, the electroactive composition further comprises a second host material. In some embodiments, one of the host materials is a hole transport material and the other host material is an electron transport material. In some embodiments, the first deuterated host is a hole transport material. In some embodiments, the first deuterated host is an electron transport material. In some embodiments, the second host material is deuterated.

In some embodiments, one of the host materials has a HOMO energy level shallower than or equal to −5.6 eV and the other host material has a LUMO deeper than −2.0 eV. In some embodiments, the first deuterated host material has a HOMO energy level shallower than or equal to −5.6 eV. In some embodiments, the first deuterated host material has a LUMO deeper than −2.0 eV. Methods for determining the HOMO energy level are well known and understood. In some embodiments, the level is determined by ultraviolet photoelectron spectroscopy ("UPS"). In some embodiments, the HOMO is between −5.0 and −5.6 eV. The LUMO can be determined using inverse photoelectron spectroscopy ("IPES").

In some embodiments, the weight ratio of first host material to second host material is in the range of 99:1 to 1:99. In some embodiments, the ratio is in the range of 99:1 to 1.5:1; in some embodiments, 19:1 to 2:1; in some embodiments, 9:1 to 2.3:1. The first host material is different from the second host material.

In some embodiments, the first and second host materials each have a solubility in toluene of at least 0.6 wt %. In some embodiments, the solubility is at least 1 wt %.

In some embodiments, the weight ratio of total host material (first host+second host, when present) to the dopant is in the range of 5:1 to 25:1; in some embodiments, from 10:1 to 20:1.

In some embodiments, the electroactive composition comprises two or more electroluminescent dopant materials. In some embodiments, the composition comprises three dopants.

In some embodiments, the electroactive composition consists essentially of the first host material and one or more dopant materials. In some embodiments, the electroactive composition consists essentially of the first host material, the second host material, and one or more electroluminescent dopant materials, as defined and in the ratios described above.

The compositions are useful as solution processible electroactive compositions for OLED devices. The resulting devices have high efficiency and long lifetimes. In some embodiments, the materials are useful in any printed electronics application including photovoltaics and TFTs.

a. Deuterated First Host Material

The first host material has Formula I and is a deuterated material. In some embodiments, the first host is at least 10% deuterated. By this is meant that at least 10% of the H are replaced by D. In some embodiments, the first host is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the host is 100% deuterated.

The deuteration can be present on the core Q moiety, on the aryl groups Ar¹ through Ar⁴, on substituent groups on the aryl groups, or any combination thereof.

In some embodiments of Formula I, at least one D is on a substituent group on an aryl ring. In some embodiments, the substituent group is selected from alkyl and aryl.

In some embodiments of Formula I, at least one of Ar¹ through Ar⁴ is a deuterated aryl.

In some embodiments of Formula I, Ar¹ through Ar⁴ are at least 10% deuterated. By "% deuterated" or "% deuteration" is meant the ratio of deuterons to the total of hydrogens plus deuterons, expressed as a percentage. The deuteriums may be on the same or different Ar groups. In some embodiments of Formula I, Ar¹ through Ar⁴ are at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, adjacent Ar groups are joined together to form rings such as carbazole. In Formula I, "adjacent" means that the Ar groups are bonded to the same N.

In some embodiments, Ar¹ to Ar⁴ are independently selected from the group consisting of phenyl, biphenyl, terphenyl, quaterphenyl, naphthyl, phenanthryl, naphthylphenyl, phenanthrylphenyl, and deuterated analogs thereof. Analogs higher than quaterphenyl can also be used, having 5-10 phenyl or deuterated phenyl rings.

The groups referred to above are defined as follows, where the dashed lines represent possible points of attachment.

biphenyl:

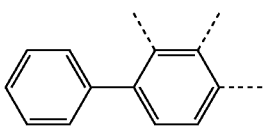

naphthyl:

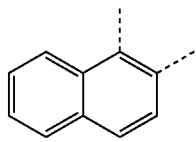

terphenyl:

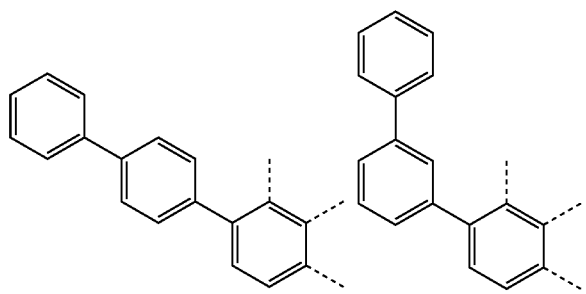

naphthylphenyl:

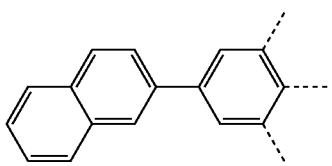

phenanthryl:

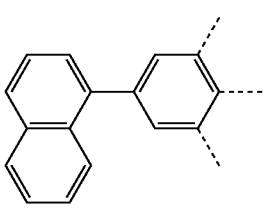

phenanthrylphenyl:

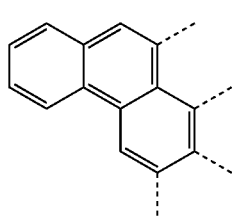

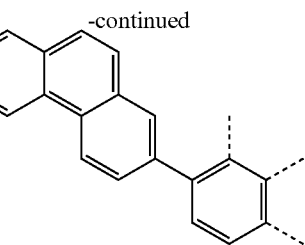

In some embodiments, at least one of $Ar^1$ through $Ar^4$ has at least one substituent other than D. Substituent groups can be present in order to alter the physical or electronic properties of the host material. In some embodiments, the substituents improve the processibility of the host material. In some embodiments, the substituents increase the solubility and/or increase the Tg of the host material. In some embodiments, the substituents are selected from the group consisting of alkyl groups, alkoxy groups, silyl groups, deuterated analogs thereof, and combinations thereof.

In some embodiments, Q is an aryl group having at least two fused rings. In some embodiments, Q has 3-5 fused aromatic rings. In some embodiments, Q is selected from the group consisting of anthracenes, chrysenes, pyrenes, phenanthrenes, triphenylenes, phenanthrolines, naphthalenes, anthracenes, quinolines, isoquinolines, quinoxalines, phenylpyridines, dibenzofurans, difuranobenzenes, indolocarbazoles, substituted derivatives thereof, and deuterated analogs thereof.

While m can have a value from 0-6, it will be understood that for some Q groups the value of m is restricted by the chemistry of the group. In some embodiments, m is 0 or 1.

In some embodiments of Formula I, R' is a fluorinated alkyl group. In some embodiments, R' is a perfluorinated alkyl group having 1-5 carbons.

In some embodiments, the deuterated first host material has Formula II

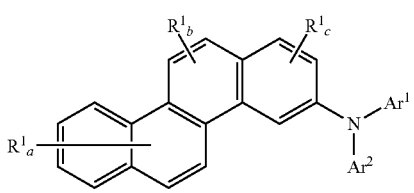

Formula II where:

R$^1$ is the same or different at each occurrence and is selected from the group consisting of D, alkyl, alkoxy, silyl, and siloxane, or adjacent R$^1$ groups may be joined together to form a 5- or 6-membered aliphatic ring, $Ar^1$ and $Ar^2$ are the same or different and are aryl groups, a is an integer from 0 to 6;

b is an integer from 0 to 2; and c is an integer from 0 to 3.

In some embodiments, R$^1$ is D and at least one of a, b, and c is greater than 0. In some embodiments, R$^1$ is D and a, b and c are all greater than 0. In some embodiments R$^1$ is D, a=5-6, b=1-2 and c=2-3.

In some embodiments, at least one $R^1$ is a branched alkyl group. In some embodiments, the branched alkyl group is selected from the group consisting of a 2-propyl group, a t-butyl group, and deuterated analogs thereof.

In some embodiments, $Ar^1$ and $Ar^2$ are phenyl groups having one or more substituents selected from the group consisting of D, alkyl, silyl, phenyl, naphthyl, N-carbazolyl, fluorenyl, and deuterated analogs thereof.

In some embodiments, $Ar^1$ and $Ar^2$ are selected from the group consisting of phenyl, biphenyl, naphthyl, phenanthryl, anthracenyl, 4-naphthylphenyl, 4-phenanthrylphenyl, where any of the preceding groups may be further substituted with one or more substituents selected from the group consisting of D, alkyl groups, silyl groups, and phenyl, and a group having Formula III:

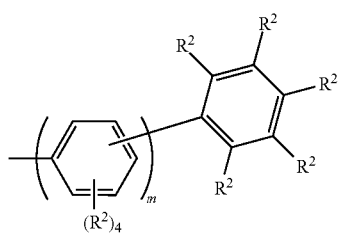

Formula III where:
$R^2$ is the same or different at each occurrence and is selected from the group consisting of H, D, alkyl, alkoxy, siloxane and silyl, or adjacent $R^2$ groups may be joined together to form an aromatic ring; and
m is the same or different at each occurrence and is an integer from 1 to 6.

In some embodiments, the deuterated first host material is a phenanthroline compound having Formula IV:

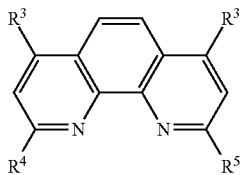

Formula IV where:
$R^3$ is the same or different and is selected from the group consisting of phenyl, naphthyl, naphthylphenyl, triphenylamino, carbazolylphenyl, and deuterated analogs thereof;
$R^4$ and $R^5$ are the same or different and are selected from the group consisting of phenyl, biphenyl, naphthyl, naphthylphenyl, phenanthryl, triphenylamino, carbazolylphenyl, and deuterated analogs thereof.

In some embodiments of Formula IV, $R^3$ through $R^5$ are selected from the group consisting of phenyl, substituted phenyl, and deuterated analogs thereof.

In some embodiments of Formula IV, both $R^3$ are phenyl and $R^4$ and $R^5$ are selected from the group consisting of 2-naphthyl, naphthylphenyl, phenanthryl, triphenylamino, m-carbazolylphenyl, and deuterated analogs thereof.

The groups not previously referred to, are defined as follows, where the dashed lines represent possible points of attachment.

triphenylamino:

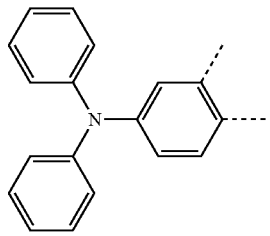

carbazolylphenyl:

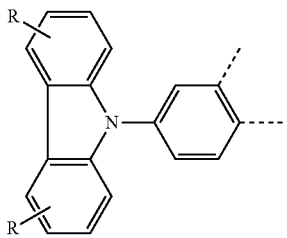

where R = aryl, alkyl

In some embodiments, the phenanthroline compounds are symmetrical, where both $R^3$ are the same and $R^4=R^5$. In some embodiments, $R^3=R^4=R^5$. In some embodiments, the phenanthroline compounds are non-symmetrical, where the two $R^3$ groups are the same but, $R^4 \neq R^5$; the two $R^3$ groups are different and $R^4=R^5$; or the two $R^3$ groups are different and $R^4 \neq R^5$.

In some embodiments, the $R^3$ groups are the same and are selected from the group consisting of phenyl, triphenylamino, carbazolylphenyl, and deuterated analogs thereof. In some embodiments, the $R^3$ groups are selected from the group consisting of p-triphenylamino (where the point of attachment is para to the nitrogen), m-carbazolylphenyl (where the point of attachment is meta to the nitrogen), and deuterated analogs thereof.

In some embodiments, $R^4=R^5$ and is selected from the group consisting of triphenylamino, naphthylphenyl, triphenylamino, m-carbazolylphenyl, and deuterated analogs thereof.

In some embodiments, the first host material has a Tg greater than 95° C. The high Tg allows for the formation of smooth and robust films. There are two primary ways in which Tg is routinely measured: Differential Scanning Calorimetry ("DSC"), and Thermo-Mechanical Analysis ("TMA"). In some embodiments, the Tg is measured by DSC. In some embodiments the Tg is between 100 and 150° C.

In some embodiments, the first host material has a triplet energy level greater than 2.0 eV. This is particularly useful when the dopant is an organometallic material in order to prevent quenching of the emission. The triplet energy can either be calculated a priori, or be measured using pulse radiolysis or low temperature luminescence spectroscopy.

Examples of deuterated first host materials include, but are not limited to, compounds A1 to A19 below.

A1:
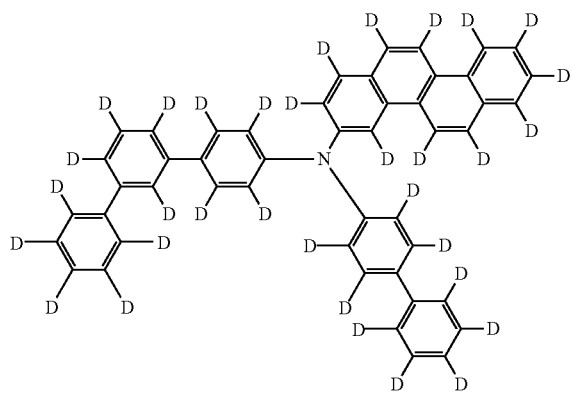
A2:
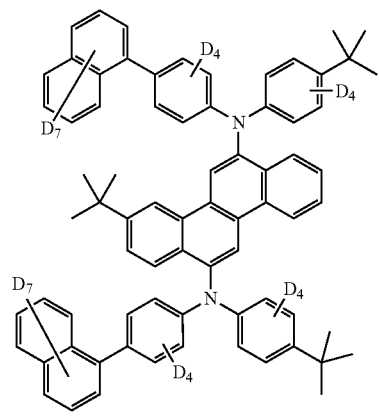
A3:
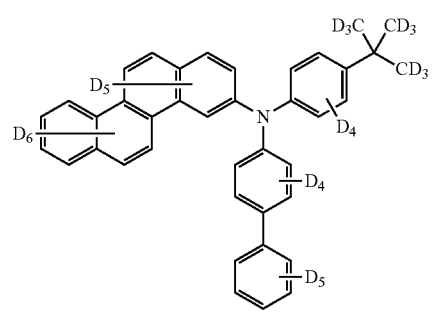
A4:
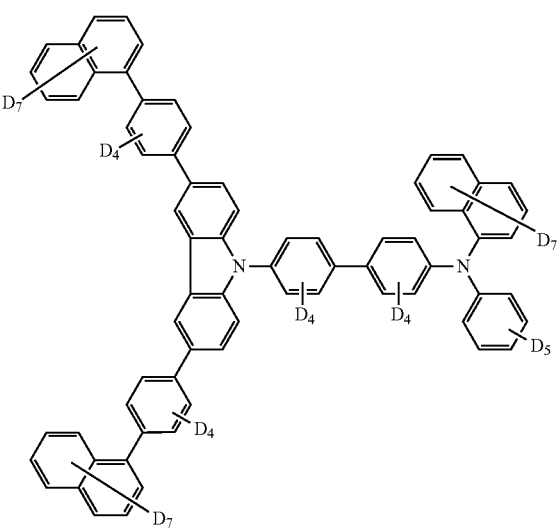
A5:
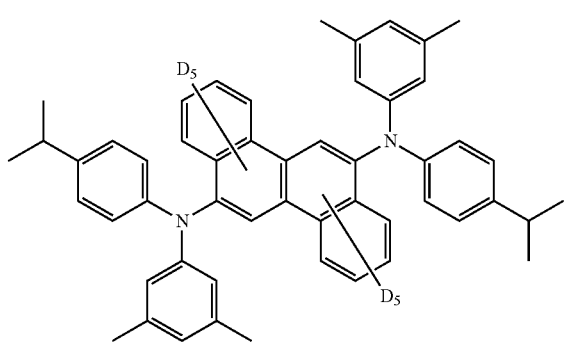
A6:
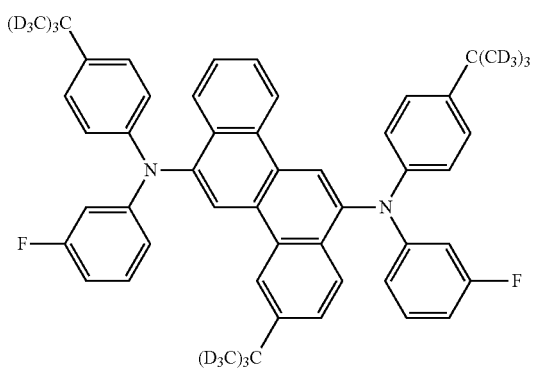

A7:
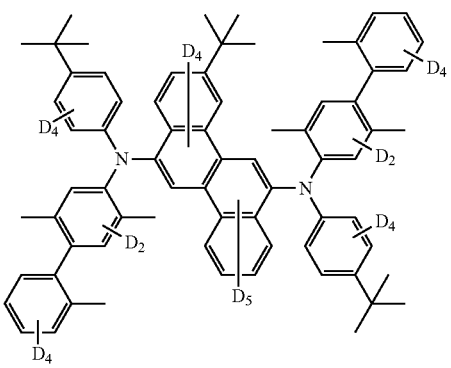
A8:
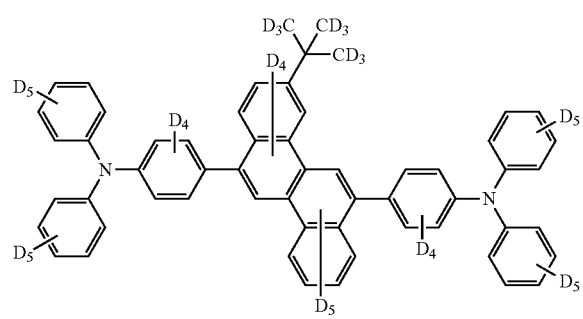
A9:
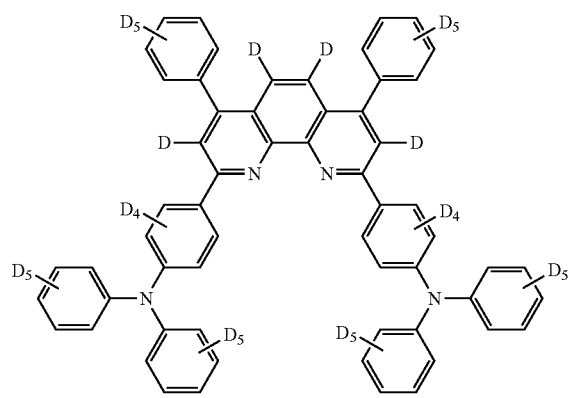
A10:
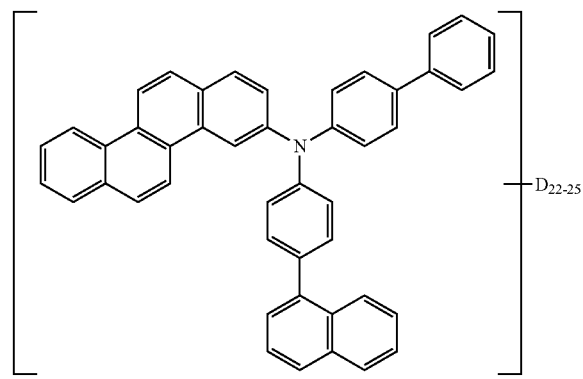
A11:
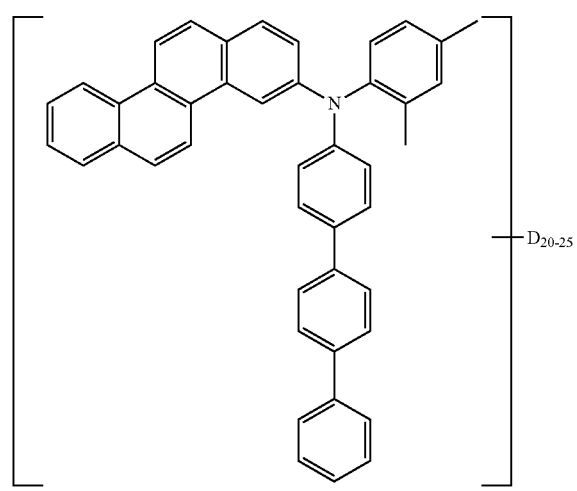

-continued
A12:
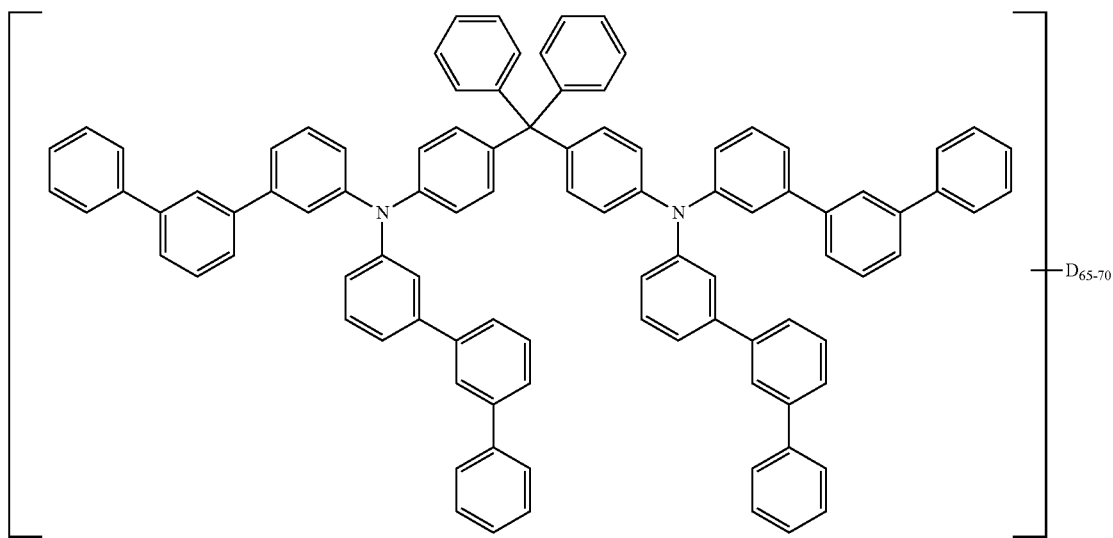
A13:
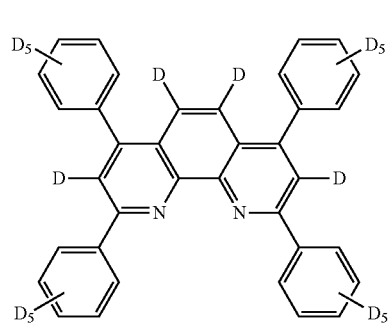
A14:
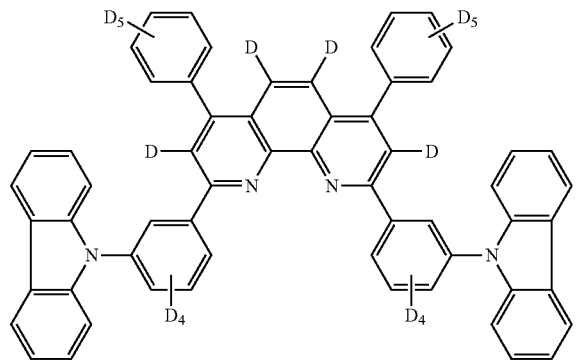
A15:
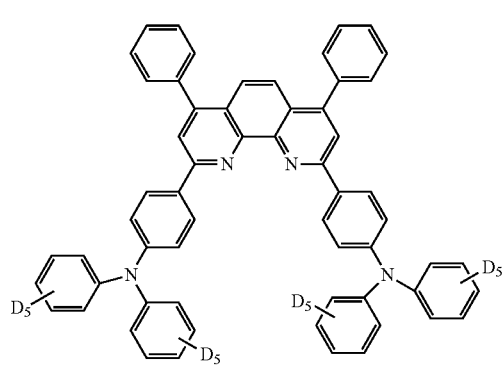
A16:
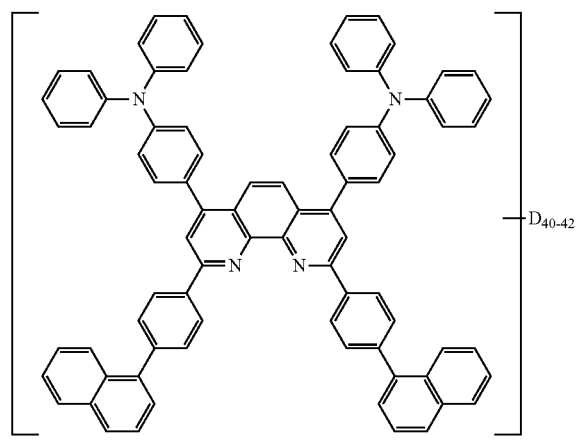

A17:

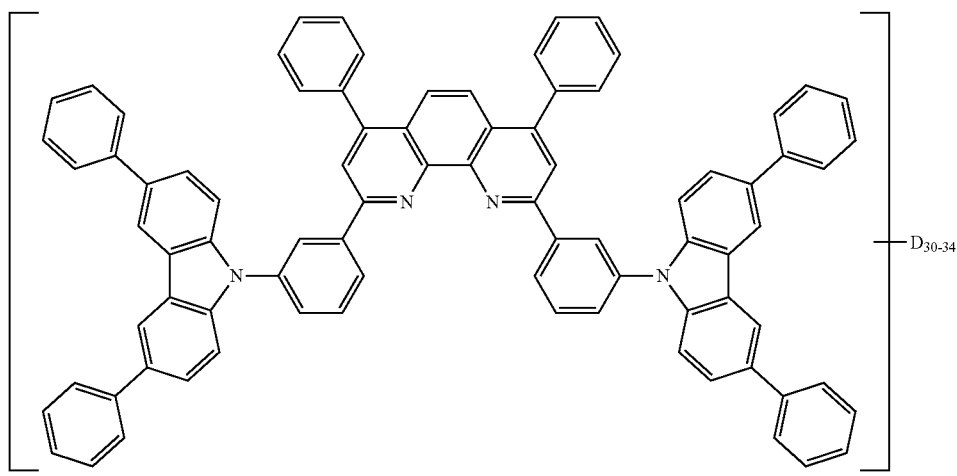

The non-deuterated analogs of the first host compound can be prepared by known coupling and substitution reactions. In some embodiments, the phenanthroline host compounds are made by Suzuki coupling of dichloro phenanthrolines with the boronic acid analog of the desired substituent. The new deuterated compounds can then be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum chloride, or acids such as $CF_3COOD$, DCl, etc. Exemplary preparations are given in the Examples. The level of deuteration can be determined by NMR analysis and by mass spectrometry, such as Atmospheric Solids Analysis Probe Mass Spectrometry (ASAP-MS).

The starting materials of the perdeuterated or partially deuterated aromatic compounds or alkyl compounds can be purchased from commercial sources or can be obtained using known methods. Some examples of such methods can be found in a) "Efficient H/D Exchange Reactions of Alkyl-Substituted Benzene Derivatives by Means of the Pd/C—H2-D20 System" Hiroyoshi Esaki, Fumiyo Aoki, Miho Umemura, Masatsugu Kato, Tomohiro Maegawa, Yasunari Monguchi, and Hironao Sajiki Chem. Eur. J. 2007, 13, 4052-4063. b) "Aromatic H/D Exchange Reaction Catalyzed by Groups 5 and 6 Metal Chlorides" GUO, Qiao-Xia, SHEN, Bao-Jian; GUO, Hai-Qing TAKAHASHI, Tamotsu *Chinese Journal of Chemistry*, 2005, 23, 341-344; c) "A novel deuterium effect on dual charge-transfer and ligand-field emission of the cis-dichlorobis(2,2'-bipyridine)iridium(III) ion" Richard J. Watts, Shlomo Efrima, and Horia Metiu *J. Am. Chem. Soc.*, 1979, 101 (10), 2742-2743; d) "Efficient H-D Exchange of Aromatic Compounds in Near-Critical D20 Catalysed by a Polymer-Supported Sulphonic Acid" Carmen Boix and Martyn Poliakoff Tetrahedron Letters 40 (1999) 4433-4436; e) U.S. Pat. No. 3,849,458; f) "Efficient C—H/C-D Exchange Reaction on the Alkyl Side Chain of Aromatic Compounds Using Heterogeneous Pd/C in D20" Hironao Sajiki, Fumiyo Aoki, Hiroyoshi Esaki, Tomohiro Maegawa, and Kosaku Hirota *Org. Lett.*, 2004, 6 (9), 1485-1487.

Exemplary preparations are given in the Examples.

The compounds described herein can be formed into films using liquid deposition techniques. Surprisingly and unexpectedly, these compounds can have greatly improved properties when compared to analogous non-deuterated compounds. Electronic devices including an active layer with the compounds described herein, have greatly improved lifetimes. In addition, the lifetime increases are achieved without any significant detrimental effect on other device properties. In some embodiments, lifetime is increased in combination with high quantum efficiency and good color saturation. Furthermore, the deuterated compounds described herein have greater air tolerance than the non-deuterated analogs. This can result in greater processing tolerance both for the preparation and purification of the materials and in the formation of electronic devices using the materials.

b. Dopant Materials

The dopant is an electroactive material which is capable of electroluminescence having an emission maximum between 380 and 750 nm. In some embodiments, the dopant emits red, green, or blue light. In some embodiments, the dopant is also deuterated.

In some embodiments, the dopant is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Electroluminescent dopant materials include small molecule organic luminescent compounds, luminescent metal complexes, and combinations thereof. Examples of small molecule luminescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (AlQ); cyclometalated iridium and platinum electroluminescent compounds, such as complexes of iridium with phenylpyridine, phenylquinoline, phenylisoquinoline or phenylpyrimidine ligands.

Examples of red light-emitting materials include, but are not limited to, cyclometalated complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, bis(diarylamino)anthracenes, and polyphenylenevinylene polymers. Green light-emitting materials have been disclosed in, for example, published PCT application WO 2007/021117.

Examples of blue light-emitting materials include, but are not limited to, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, the dopant is an organometallic complex. In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is an organometallic complex having the formula $Ir(L1)_a(L2)_b(L3)_c$; where
L1 is a monoanionic bidentate cyclometalating ligand coordinated through carbon and nitrogen;
L2 is a monoanionic bidentate ligand which is not coordinated through a carbon;
L3 is a monodentate ligand;
a is 1-3;
b and c are independently 0-2; and
a, b, and c are selected such that the iridium is hexacoordinate and the complex is electrically neutral.
Some examples of formulae include, but are not limited to, $Ir(L1)_3$; $Ir(L1)_2(L2)$; and $Ir(L1)_2(L3)(L3')$, where L3 is anionic and L3' is nonionic.

Examples of L1 ligands include, but are not limited to phenylpyridines, phenylquinolines, phenylpyrimidines, phenylpyrazoles, thienylpyridines, thienylquinolines, thienylpyrimidines, and deuterated analogs thereof. As used herein, the term "quinolines" includes "isoquinolines" unless otherwise specified. The fluorinated derivatives can have one or more fluorine substituents. In some embodiments, there are 1-3 fluorine substituents on the non-nitrogen ring of the ligand.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; phosphinoalkanols (phosphinoalkoxide ligands); and deuterated analogs thereof.

Monodentate ligand L3 can be anionic or nonionic. Anionic ligands include, but are not limited to, H⁻ ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, deuterated analogs thereof, and the like. In some cases, ligands listed above as L2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.

In some embodiments, the dopant is a red light-emitting organometallic compound. Some non-limiting examples of red dopants are compounds D1 through D7 below.

D1:

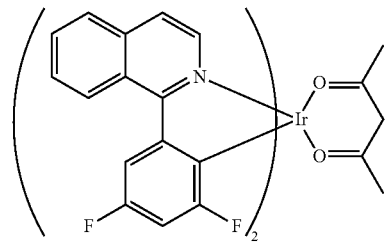

D2:

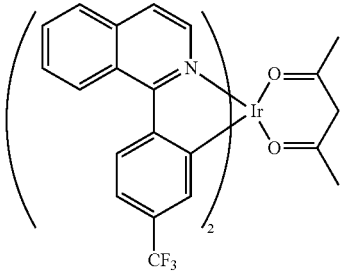

D3:

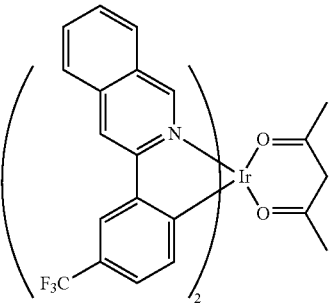

D4:

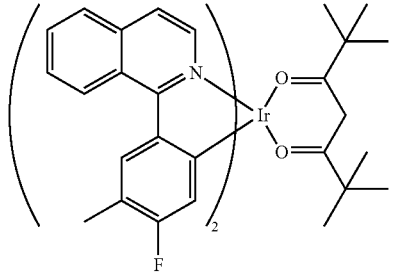

D4:

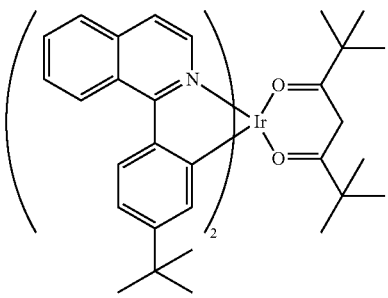

D6:

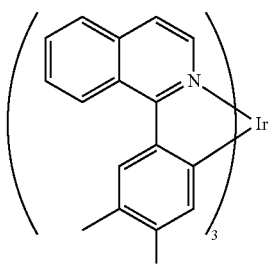

D7:

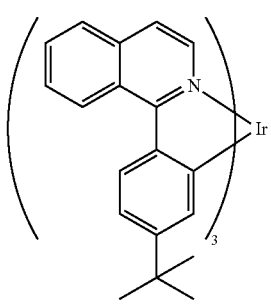

In some embodiments, the electroactive dopant is selected from the group consisting of a non-polymeric spirobifluorene compound, a fluoranthene compound, and deuterated analogs thereof.

In some embodiments, the electroactive dopant is a compound having aryl amine groups. In some embodiments, the electroactive dopant is selected from the formulae below:

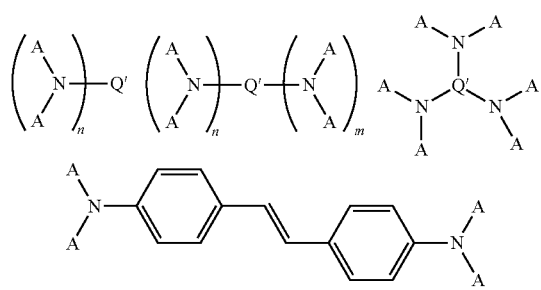

where:

A is the same or different at each occurrence and is an aromatic group having from 3-60 carbon atoms;

Q' is a single bond or an aromatic group having from 3-60 carbon atoms;

n and m are independently an integer from 1-6.

In the above formula, the n and m may be limited by the number of available sites on the core Q' group.

In some embodiments of the above formula, at least one of A and Q' in each formula has at least three condensed rings. In some embodiments, m and n are equal to 1.

In some embodiments, Q' is a styryl or styrylphenyl group.

In some embodiments, Q' is an aromatic group having at least two condensed rings. In some embodiments, Q' is selected from the group consisting of naphthalene, anthracene, benz[a]anthracene, dibenz[a,h]anthracene, fluoranthene, fluorene, spirofluorene, tetracene, chrysene, pyrene, tetracene, xanthene, perylene, coumarin, rhodamine, quinacridone, rubrene, substituted derivatives thereof, and deuterated analogs thereof.

In some embodiments, A is selected from the group consisting of phenyl, biphenyl, tolyl, naphthyl, naphthylphenyl, anthracenyl, and deuterated analogs thereof.

In some embodiments, the electroluminescent material has the structure

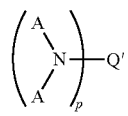

where A is an aromatic group, p is 1 or 2, and Q' is selected from the group consisting of:

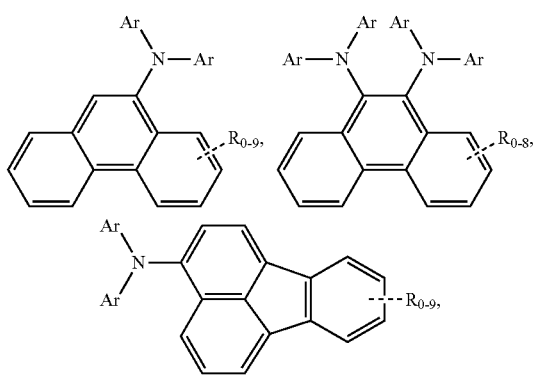

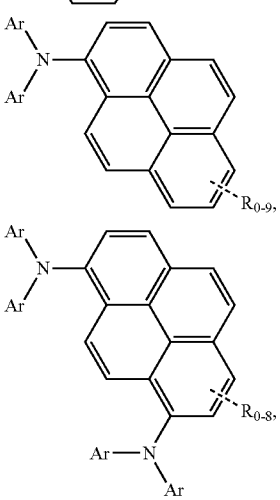

-continued

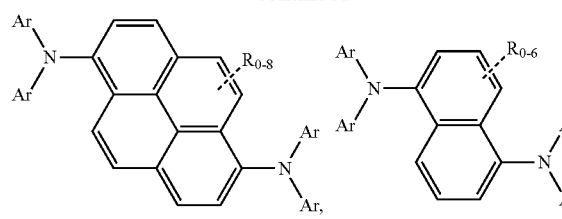

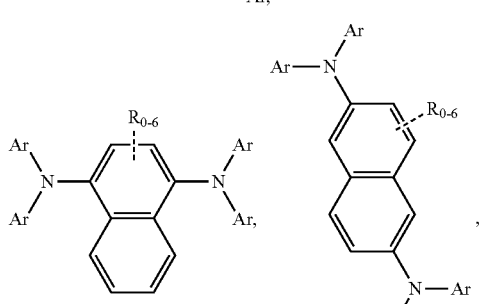

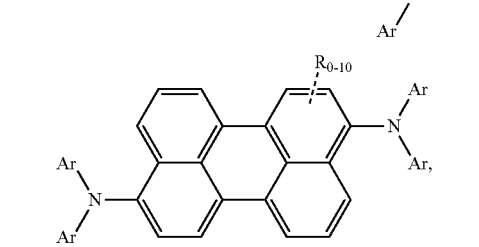

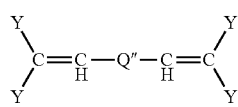

-continued

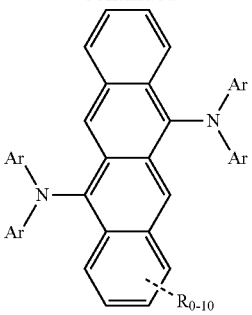

wherein:

R is the same or different at each occurrence and is selected from the group consisting of D, alkyl, alkoxy and aryl, where adjacent R groups may be joined together to form a 5- or 6-membered aliphatic ring;

Ar is the same or different and is selected from the group consisting of aryl groups.

The dashed line in the formula is intended to indicate that the R group, when present, can be at any site on the core Q' group.

In some embodiments, the electroactive dopant has the formula below:

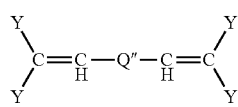

where:

Y is the same or different at each occurrence and is an aromatic group having 3-60 carbon atoms;

Q" is an aromatic group, a divalent triphenylamine residue group, or a single bond.

In some embodiments, the electroactive dopant is an aryl acene. In some embodiments, the electroactive dopant is a non-symmetrical aryl acene.

In some embodiments, the electroactive dopant is a chrysene derivative. The term "chrysene" is intended to mean 1,2-benzophenanthrene. In some embodiments, the electroactive dopant is a chrysene having aryl substituents. In some embodiments, the electroactive dopant is a chrysene having arylamino substituents. In some embodiments, the electroactive dopant is a chrysene having two different arylamino substituents. In some embodiments, the chrysene derivative has a deep blue emission.

In some embodiments, separate electroactive compositions with different dopants are used to provide different colors. In some embodiments, the dopants are selected to have red, green, and blue emission. As used herein, red refers to light having a wavelength maximum in the range of 600-700 nm; green refers to light having a wavelength maximum in the range of 500-600 nm; and blue refers to light having a wavelength maximum in the range of 400-500 nm.

Examples of small molecule organic dopant materials include, but are not limited to, compounds D8 to D13 below.

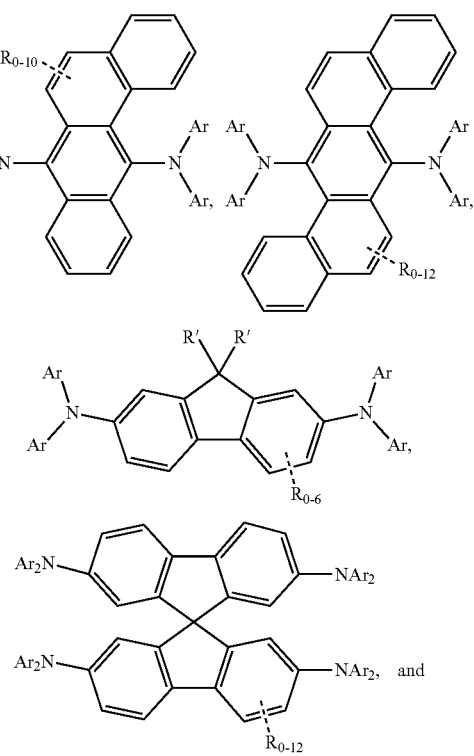

D8
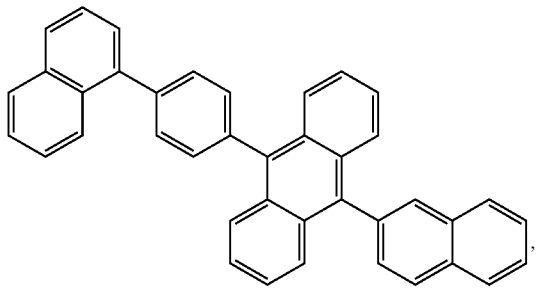

D9
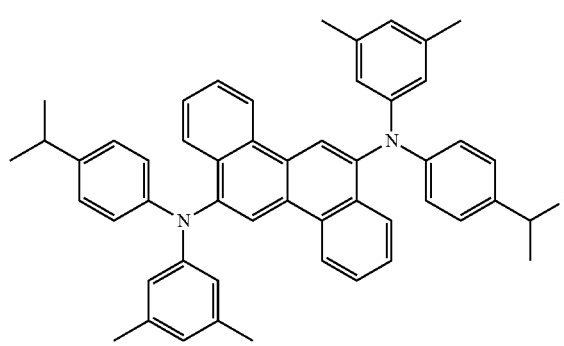

D10
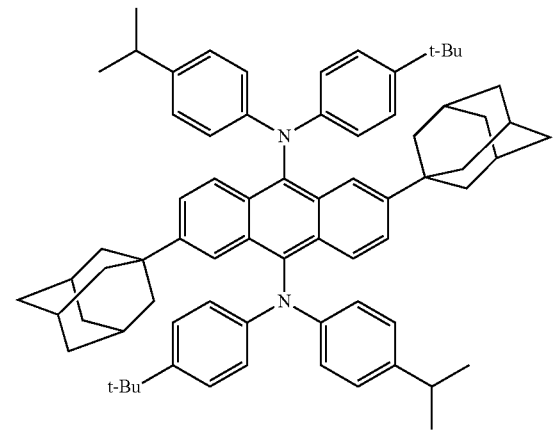

D11
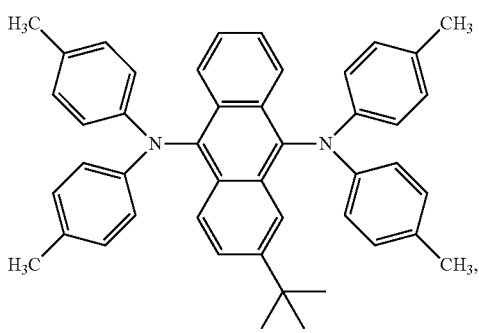

D12
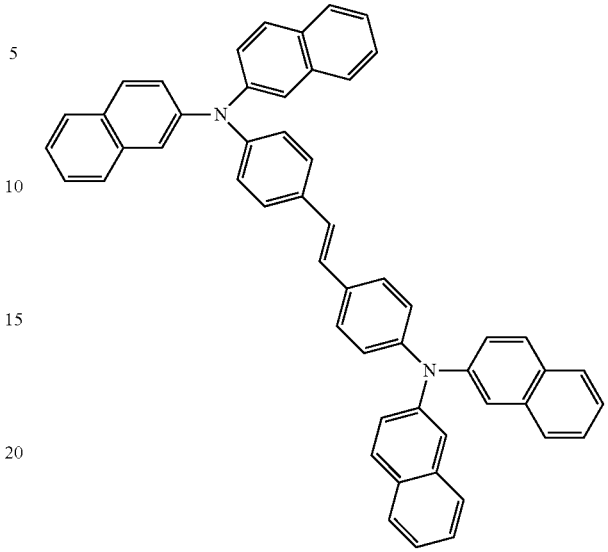

D13
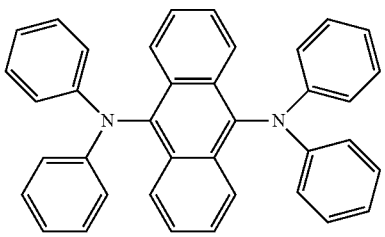

c. Optional Second Host Material

In some embodiments, a second host material is present in the electroactive composition. The second host material is an optional component.

In some embodiments, the second host is at least 10% deuterated. By this is meant that at least 10% of the H are replaced by D. In some embodiments, the second host is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the second host is 100% deuterated.

The second host can be any of the materials discussed above for the first host material. In some embodiments, the second host material is selected from the group consisting of phenanthrolines, quinoxalines, phenylpyridines, benzodifurans, difuranobenzenes, indolocarbazoles, benzimidazoles, triazolopyridines, diheteroarylphenyls, metal quinolinate complexes, substituted derivatives thereof, deuterated analogs thereof, and combinations thereof. In some embodiments, the aforementioned second host compounds have a substituent selected from the group consisting of aryl, alkyl, and deuterated analogs thereof. In some embodiments, the heteroaryl group is selected from the group consisting of pyridine, pyrazine, pyrimidine, pyridazine, triazines, tetrazines, quinazoline, quinoxaline, naphthylpyridines, heterobiaryl analogs thereof, heterotriaryl analogs thereof, and deuterated analogs thereof.

In some embodiments, the second host is selected from structures 1-9, below, or a deuterated analog thereof.

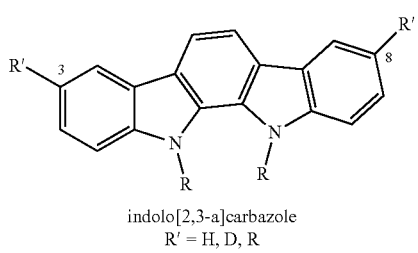

indolo[2,3-a]carbazole
R' = H, D, R

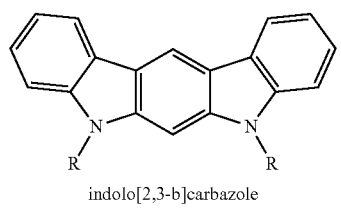

indolo[2,3-b]carbazole

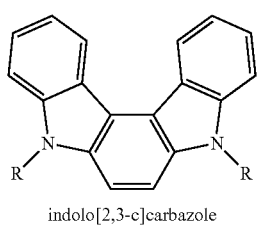

indolo[2,3-c]carbazole

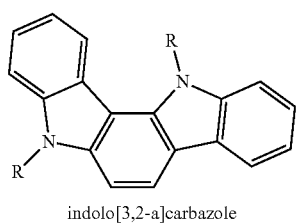

indolo[3,2-a]carbazole

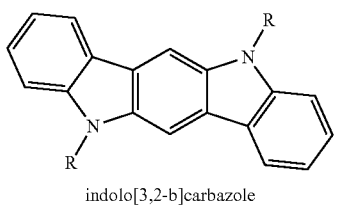

indolo[3,2-b]carbazole

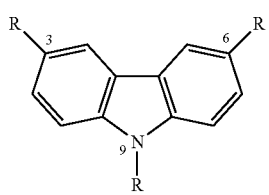

9H-carbazole
3,6,9-trisubstituted shown

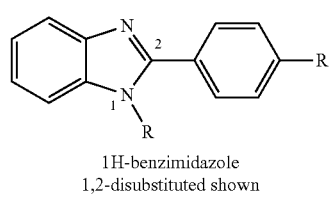

1H-benzimidazole
1,2-disubstituted shown

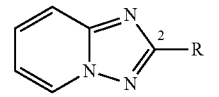

[1,2,4]triazolo[1,5-a]pyridine
2-substituted shown

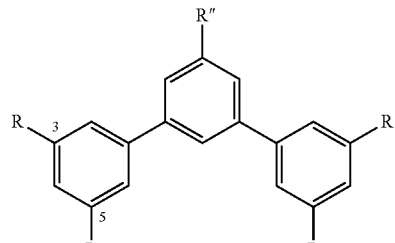

3,5-diheteroarylphenyls
R'' = H, D, CH$_3$, CD$_3$ where R is selected from aryl, heteroaryl, and alkyl. In some embodiments, the heteroaryl group is selected from structures 10-20 below, or a deuterated analog thereof.

pyridine

pyrazine

pyrimidine

pyridazine

1,2,4-triazine

1,3,5-triazine

-continued

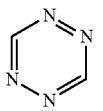
1,2,5,6-tetrazine

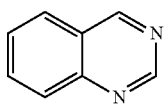
quinazoline

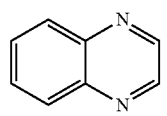
quinoxoline

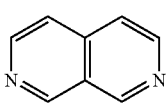
2,7-naphthyridine

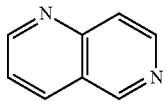
1,6-naphthyridine

In some embodiments, the group is a heterobiaryl derivative or a heterotriaryl derivative.

In some embodiments, the second host material has one of the structures shown below

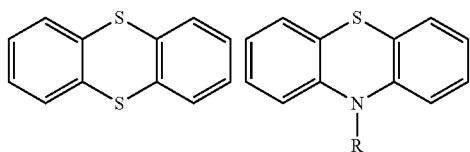

where R is selected from aryl, heteroaryl, and alkyl. In some embodiments, the above structures are further substituted with aryl or heteroaryl groups. In some embodiments, the heteroaryl group is selected from structures 10-20 above, or a deuterated analog thereof.

In some embodiments, the second host material also has a triplet energy level greater than 2.0 eV. This is particularly useful when the dopant is an organometallic material in order to prevent quenching of the emission. In some embodiments, both the first host material and the second host material have a triplet energy level greater than 2.0 eV.

The second host compounds can be made by known synthetic techniques.

3. Electronic Device

Organic electronic devices that may benefit from having the electroactive composition described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), and (4) devices that include one or more electronic components that include one or more organic semiconductor layers (e.g., a transistor or diode).

In some embodiments, an organic light-emitting device comprises:
an anode;
a hole transport layer;
an electroactive layer;
an electron transport layer, and
a cathode;
wherein the electroactive layer comprises the composition described above.

One illustration of an organic electronic device structure is shown in FIG. 1. The device 100 has a first electrical contact layer, an anode layer 110 and a second electrical contact layer, a cathode layer 160, and an electroactive layer 140 between them. Adjacent to the anode is a hole injection layer 120. Adjacent to the hole injection layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

Figure 2:
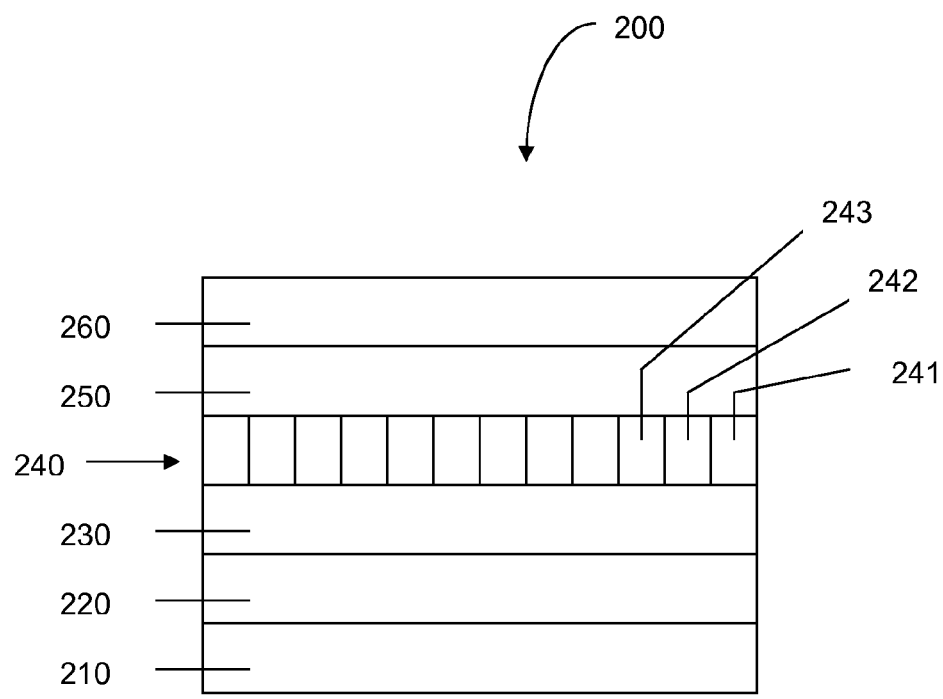
FIG. 2 includes an illustration of an exemplary organic device.

In some embodiments, the electroactive layer 140 is pixellated, as shown in FIG. 2. Layer 140 is divided into pixel or subpixel units 141, 142, and 143 which are repeated over the layer. Each of the pixel or subpixel units represents a different color. In some embodiments, the subpixel units are for red, green, and blue. Although three subpixel units are shown in the figure, two or more than three may be used.

In one embodiment, the different layers have the following range of thicknesses: anode 110, 500-5000 Å, in one embodiment 1000-2000 Å; hole injection layer 120, 50-3000 Å, in one embodiment 200-1000 Å; hole transport layer 130, 50-2000 Å, in one embodiment 200-1000 Å; electroactive layer 140, 10-2000 Å, in one embodiment 100-1000 Å; layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the electroactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

a. Electroactive Layer

The electroactive layer comprises the electroactive composition described above.

The electroactive layer can be formed by liquid deposition from a liquid composition, as described below. In some embodiments, the electroactive layer is formed by vapor deposition.

In some embodiments, three different electroactive compositions are applied by liquid deposition to form red, green, and blue subpixels. In some embodiments, each of the colored subpixels is formed using new electroactive compositions as described herein. In some embodiments, the host materials are the same for all of the colors. In some embodiments, different host materials are used for the different colors.

b. Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," *Nature* vol. 357, pp 477-479 (11 Jun. 1992). At least one of the anode and cathode is desirably at least partially transparent to allow the generated light to be observed.

The hole injection layer 120 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapour deposited or deposited from liquids which may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can comprise charge transfer compounds, and the like, such as copper phthalocyanine and the tetrathiafulvalene-tetracyanoquinodimethane system (TTF-TCNQ).

In some embodiments, the hole injection layer comprises at least one electrically conductive polymer and at least one fluorinated acid polymer. Such materials have been described in, for example, published U.S. patent applications US 2004/0102577, US 2004/0127637, US 2005/0205860, and published PCT application WO 2009/018009.

Examples of hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (α-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. In some embodiments, the hole transport layer further comprises a p-dopant. In some embodiments, the hole transport layer is doped with a p-dopant. Examples of p-dopants include, but are not limited to, tetrafluorotetracyanoquinodimethane (F4-TCNQ) and perylene-3,4,9,10-tetracarboxylic-3,4,9,10-dianhydride (PTCDA).

Examples of electron transport materials which can be used for layer 150 include, but are not limited to, metal chelated oxinoid compounds, including metal quinolate derivatives such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri (phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and $Li_2O$ can also be deposited between the organic layer and the cathode layer to lower the operating voltage.

It is known to have other layers in organic electronic devices. For example, there can be a layer (not shown) between the anode 110 and hole injection layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

c. Device Fabrication

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the process for making an organic light-emitting device, comprises:
providing a substrate having a patterned anode thereon;
forming an electroactive layer by depositing a first liquid composition comprising (a) a deuterated first host material, (b) an electroluminescent dopant material, and (c) a liquid medium; and
forming a cathode overall.

The term "liquid composition" is intended to include a liquid medium in which one or more materials are dissolved to form a solution, a liquid medium in which one or more materials are dispersed to form a dispersion, or a liquid medium in which one or more materials are suspended to form a suspension or an emulsion.

In some embodiments, the process further comprises:
forming a hole transport layer prior to forming the electroactive layer, wherein the hole transport layer is formed by depositing a second liquid composition comprising a hole transport material in a second liquid medium.

In some embodiments, the process further comprises:
forming an electron transport layer after forming the electroactive layer, wherein the electron transport layer is formed by depositing a third liquid composition comprising an electron transport material in a third liquid medium.

Any known liquid deposition technique or combination of techniques can be used, including continuous and discontinuous techniques. Examples of continuous liquid deposition techniques include, but are not limited to spin coating, gravure coating, curtain coating, dip coating, slot-die coating, spray coating, and continuous nozzle printing. Examples of discontinuous deposition techniques include, but are not limited to, ink jet printing, gravure printing, and screen printing. In some embodiments, the electroactive layer is formed in a pattern by a method selected from continuous nozzle coating and ink jet printing. Although the nozzle printing can be considered a continuous technique, a pattern can be formed by placing the nozzle over only the desired areas for layer formation. For example, patterns of continuous rows can be formed.

A suitable liquid medium for a particular composition to be deposited can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Another suitable liquid for use in making the liquid composition, either as a solution or dispersion as described herein, comprising the new compound, includes, but not limited to, a chlorinated hydrocarbon (such as methylene chloride, chloroform, chlorobenzene), an aromatic hydrocarbon (such as a substituted or non-substituted toluene or xylenes, including trifluorotoluene), a polar solvent (such as tetrahydrofuran (THF), N-methyl pyrrolidone (NMP)), an ester (such as ethylacetate), an alcohol (such as isopropanol), a ketone (such as cyclopentatone), or any mixture thereof. Examples of mixtures of solvents for light-emitting materials have been described in, for example, published US application 2008-0067473.

In some embodiments, the weight ratio of total host material (first host together with second host, when present) to the dopant is in the range of 5:1 to 25:1.

After deposition, the material is dried to form a layer. Any conventional drying technique can be used, including heating, vacuum, and combinations thereof.

In some embodiments, the device is fabricated by liquid deposition of the hole injection layer, the hole transport layer, and the electroactive layer, and by vapor deposition of the anode, the electron transport layer, an electron injection layer and the cathode.

EXAMPLES

The concepts described herein will be further described in the following examples, which do not limit the scope of the invention described in the claims.

Example 1

This example illustrates the preparation of deuterated host compound A1.

a. Preparation of 3-Bromochrysene

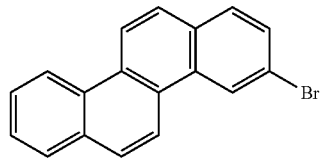 [SMILES: Brc1ccc2ccc3c4ccccc4ccc3c2c1]

(i) Preparation of 1-(4-bromostyryl)naphthalenes

An oven-dried two-liter four-neck round-bottom flask was equipped with a magnetic stir bar, addition funnel, thermometer adapter and nitrogen inlet and charged (1-napthylmethyl) triphenylphosphonium chloride (49.87 g, 113.6 mmol) and dry THF (970 ml). The slurry was cooled to −5° C. and n-BuLi (50 ml, 125 mmol, 2.5 M solution) was added via addition funnel over the period of 25 min. Residual n-BuLi was washed out of the addition funnel with 10 mL of THF. A very dark red solution formed and was left to stir for 15 min. Reaction mixture was then cooled to −75° C. and 4-bromobenzaldehyde (21.0 g, 113.6 mmol) dissolved in dry THF (ca. 75 ml) was added dropwise over 30 min, keeping the temp at −75° C. Residual aldehyde was washed out of the addition funnel with 20 mL of THF. Reaction mixture was left in the cold bath to gradually warm up to rt while stirring overnight. Next day, reaction was quenched with water (30 ml) and volatiles were removed on the rotavap. Residue was stirred in 500 ml of hexane and then filtered. Solids were washed with hexane. Filtrate was concentrated to give crude product which was purified by column chromatography (0-100% CH$_2$Cl$_2$ in hexanes). Yield 17.7 g (50%). Structure was confirmed by $^1$H NMR spectroscopy.

(ii) Preparation of 3-bromochrysene 1-(4-Bromostyryl)naphthalenes (5.0 g, 16.2 mmol) were dissolved in dry toluene (1 l) in a one-liter photochemical vessel, equipped with nitrogen inlet and a stir bar. A bottle of dry propylene oxide was cooled in ice-water before 100 ml of the epoxide was withdrawn with a syringe and added to the reaction mixture. Iodine (4.2 g, 16.5 mmol) was added last. Condenser was attached on top of the photochemical vessel and halogen lamp (Hanovia, 450 W) was turned on. Reaction was stopped by turning off the lamp when no more iodine was left in the reaction mixture, as evidenced by the disappearance of its color. The reaction was complete in two hours. Toluene and excess propylene oxide were removed under reduced pressure to yield a dark yellow solid. Crude product was washed with diethyl ether to give 3.4 g (68%) of 3-bromochrysene as an off-white solid. Structure was confirmed by $^1$H NMR spectroscopy.

b. Preparation of Perdeutero-3-bromochrysene

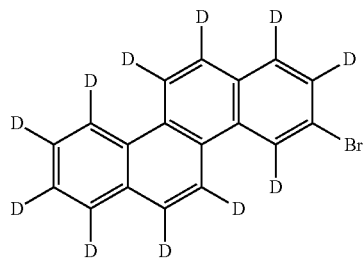 [SMILES: [2H]c1c([2H])c([2H])c2c(c1[2H])c([2H])c([2H])c1c3c([2H])c(Br)c([2H])c([2H])c3c([2H])c([2H])c21]

In the glove box, 3-bromochrysene (2 g, 6.5 mmol) was placed into a flask and dissolved in 100 ml of dry C$_6$D$_6$. Aluminum trichloride (0.26 g, 1.95 mmol) was added next, followed by 20 ml of additional C$_6$D$_6$. Reaction mixture darkened within five minutes and was left to stir for 30 minutes. The mixture was quenched with D$_2$O (20 ml), stirred for 25 min (dark color went away), and transferred to a separatory funnel. Organic layer was removed and washed with water (twice) and brine (three times). The organic phase was dried over MgSO$_4$ and then concentrated to give crude product, which was triturated with diethyl ether. Yield 1.8 g (87%) of white solid. The product is 95.4% deuterated as determined by $^1$H NMR spectroscopy against an internal standard. Identity and purity of the product were established by mass spectrometry and liquid chromatography.

c. Preparation of Perdeutero-N-([1,1$^1$-biphenyl]-4-yl)-[1,1':3',1''-terphenyl]-4-amine

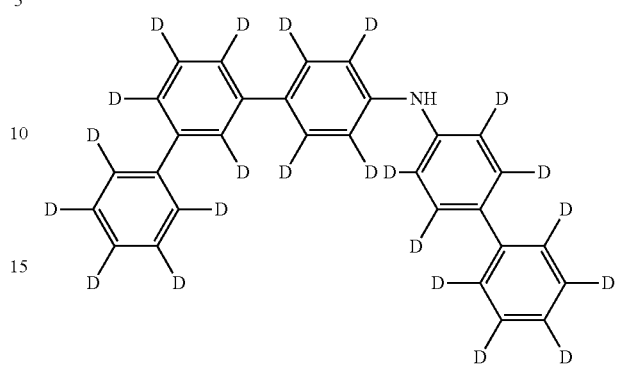

Deuteration of 4-bromobiphenyl and 4-bromo-1,1':3',1''-terphenyl was done as described above for perdeutero-3-bromochrysene. Identity and purity of the products were established by $^1$H NMR spectroscopy, mass spectrometry and liquid chromatography.

(i) Preparation of perdeutero-4-aminobiphenyl

In a drybox, [1,1'-biphenyl]-2-yldicyclohexylphosphine (34.7 mg, 0.099 mmol), tris(dibenzylideneacetone) dipalladium(0) (37.8 mg, 0.041 mmol) and lithium hexamethyldisilazide (1.66 g, 9.91 mmol) were placed into a thick-walled glass tube. Perdeutero-4-bromobiphenyl was dissolved in 19 ml of toluene and added to the mixture. Tube was sealed, taken out of the box and heated at 80° C. for 16 hours. Reaction mixture was cooled to rt and quenched with 80 ml of 1M aqueous HCl. The mixture was stirred for five minutes and then neutralized with 2M aqueous NaOH to pH=11. Organics were extracted with CH$_2$Cl$_2$ (2×40 ml), then dried with brine (150 ml) and Na$_2$SO$_4$. Volatiles were removed on the rotavap. Crude product was purified by flash column chromatography (70 to 85% CH$_2$Cl$_2$ in hexanes). Yield 820 mg (56%). The product maintained its degree of deuteration as determined by $^1$H NMR spectroscopy against an internal standard. Identity and purity of the product were established by $^1$H NMR spectroscopy, mass spectrometry and liquid chromatography.

(ii) Preparation of Perdeutero-N-([1,1'-biphenyl]-4-yl)-[1,1':3',1''-terphenyl]-4-amine In a drybox, perdeutero-4-aminobiphenyl (0.542 g, 3.04 mmol) and perdeutero-4-bromo-1,1':3',1''-terphenyl (0.89 g, 2.76 mmol) were combined in a round-bottom flask and dissolved in 10 ml of dry toluene. Tris(tert-butyl)phosphine (0.022 g, 0.11 mmol) and tris(dibenzylideneacetone) dipalladium(0) (0.05 g, 0.055 mmol) were dissolved in 10 ml of dry toluene and stirred for 5 minutes. The catalyst solution was added to the reaction mixture, stirred for 2 minutes and was followed by sodium tert-butoxide (0.32 g, 3.3 mmol). Flask was capped and left to stir in the drybox overnight at room temperature. Next day, reaction mixture was taken out of the box and filtered through a one-inch plug of silica gel topped with celite, washing with 500 ml of dichloromethane. Removal of volatiles under reduced pressure gave a yellow solid. Crude product was purified by trituration with diethyl ether to give 0.85 g (73%) of a white solid. The product is 80% deuterated as determined by $^1$H NMR spectroscopy against an internal standard. Identity and purity of the product were established by mass spectrometry and liquid chromatography.

d. Preparation of Perdeutero-N-([1,1'-biphenyl]-4-yl)-N-([1,1':3',1''-terphenyl]-4-yl)chrysen-3-amine, Compound A1.

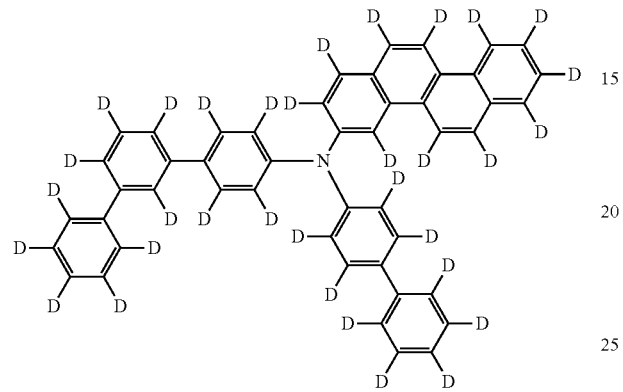

In a drybox, perdeutero-N-([1,1'-biphenyl]-4-yl)-[1,1':3', 1''-terphenyl]-4-amine (0.849 g, 2.02 mmol) and perdeutero-3-bromochrysene (0.59 g, 1.85 mmol) were combined in a thick-walled glass tube and dissolved in 20 ml of dry toluene. Tris(tert-butyl)phosphine (7.5 mg, 0.037 mmol) and tris (dibenzylideneacetone) dipalladium(0) (17 mg, 0.019 mmol) were dissolved in 10 ml of dry toluene and stirred for 10 minutes. The catalyst solution was added to the reaction mixture, stirred for 5 minutes and followed by sodium tert-butoxide (0.194 g, 2.02 mmol) and 20 ml of dry toluene. After another 10 minutes, the reaction flask was brought out of the drybox and placed into an 80° C. bath to stir overnight. Next day, reaction mixture was cooled to room temperature and filtered through a three-inch plug of silica gel and topped with half an inch of Celite, washing with 400 ml of chloroform. Removal of volatiles under reduced pressure gave a yellow solid. Crude product was purified by column chromatography with chloroform in hexane. Yield 1.05 g (87.5%) of a white solid. Identity and purity of the product were established by mass spectrometry and liquid chromatography.

Compound A1 had a Tg of about 110° C. The solubility in both toluene and anisole was greater than 20 mg/ml.

Example 2

This example illustrates the preparation of deuterated host compound A17.

a) The procedure from Yamada et al Bull Chem Soc Jpn, 63, 2710, 1990 was used to prepare the trimethylene bridged bathophenanthroline as follows: 2 g of bathophenanthroline was taken into 20 g 1,3-dibromopropane and refluxed under air. After about 30 mins the dense orange slurry was cooled. Methanol was added to dissolve the solids, and then acetone was added to precipitate a bright orange solid. This was filtered and washed with toluene and dichloromethane ("DCM") resulting in an orange powder in 2.8 g yield.

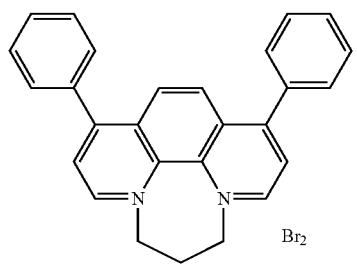

$C_{27}H_{22}Br_2N_2$
Exact Mass: 532.01
Mol. Wt.: 534.29
C, 60.70; H, 4.15; Br, 29.91; N, 5.24 b) 2.8 g of product from above was dissolved into 12 mL water and dripped into an ice-cooled solution of 21 g potassium ferricyanide and 10 g sodium hydroxide in 30 mL water over the course of about 30 mins, and then stirred for 90 mins. This was iced again and neutralized with 60 mL of 4M HCl to a pH of about 8. The pale tan/yellow solid was filtered off and suctioned dry. The filtered solid was placed in a soxhlet and extracted with chloroform to extract a brown solution. This was evaporated to a brownish oily solid and then washed with a small amount of methanol to give a pale brown solid (~1.0 g 47%). The product may be recrystallized from chloroform/methanol as golden platelets by evaporating out the chloroform from the mixture.

The structure was identified by NMR as the diketone below.

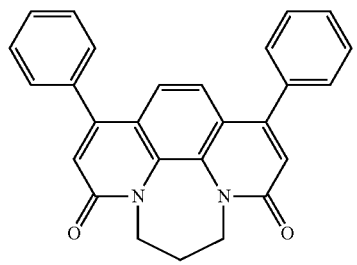

$C_{27}H_{20}N_2O_2$
Exact Mass: 404.15
Mol. Wt.: 404.46
C, 80.18; H, 4.98; N, 6.93; O, 7.91 c) Combined portions of diketone from step (b) above totaling 5.5 g (13.6 mM) were suspended in 39 mL POCl$_3$ and 5.4 g PCl$_5$ was added. This was degassed and refluxed under nitrogen for 8 hrs. The excess POCl3 was removed by evaporation. Ice was added to decompose the remaining chlorides and the mixture was neutralized with ammonia solution. The brown precipitate was collected and dried under vacuum while the mother liquor was extracted with methylene chloride. All brown material was combined, evaporated to a brown gum and methanol added. After shaking and stirring a pale yellow solid was isolated which recrystallized as off-white needles from CHCl3 and methanol (1:10). Analysis by NMR indicated the structure to be 2,9-dichloro-4,7-diphenyl-1,10-phenanthroline, shown below.

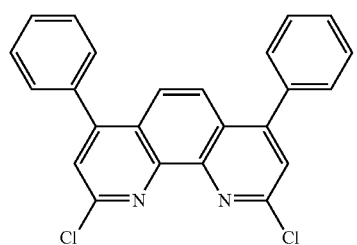

C$_{24}$H$_{14}$Cl$_2$N$_2$
Exact Mass: 400.05
Mol. Wt.: 401.29
C, 71.83; H, 3.52; Cl, 17.67; N, 6.98 d) The non-deuterated analog compound was prepared using Suzuki coupling of 2,9-dichloro-4,7-diphenyl-1,10-phenanthroline with the boronic ester shown below.

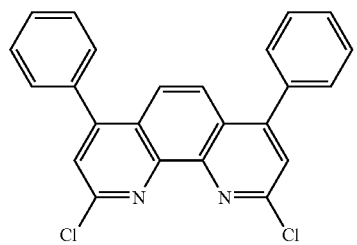

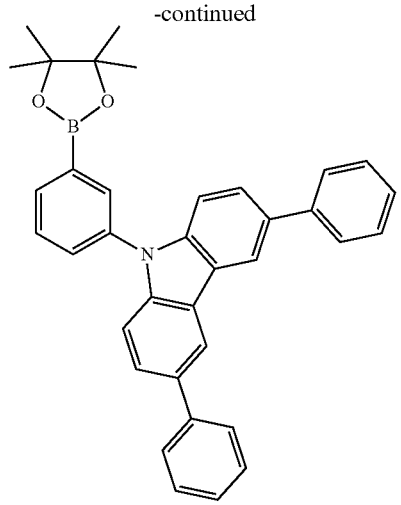

Take 1.0 g of dichloro-phen (2.5 mM) in glove box and add 3.12 g (6 mM) boronic ester. Add 0.15 g Pd$_2$DBA$_3$ (DBA=dibenzylideneacetone) (0.15 mM), 0.1 g tricyclohexylphosphine (0.35 mM) and 2.0 g potassium phosphate (9 mM) and dissolve all into 30 mL dioxane and 15 mL water. Mix and heat in glove box in mantle at 100 C for 1 hr then warm gently (minimum rheostat setting) under nitrogen overnight. Solution immediately is dark purple but on reaching ~80 C it is a tan brown slurry which slowly becomes clear brown with a dense ppt. As the solution refluxes (air condensor) a brown gummy material forms. Cool and work up by removing from glove box and add water. Extract into DCM and dry over magnesium sulfate. Purification by chromatography was carried out by eluting with DCM then DCM/methanol 2:1. Collect a pale yellow solution which was evaporated and upon addition of methanol ppts a white/pale yellow solid. The structure was confirmed by NMR analysis to be the compound B-1 shown below.

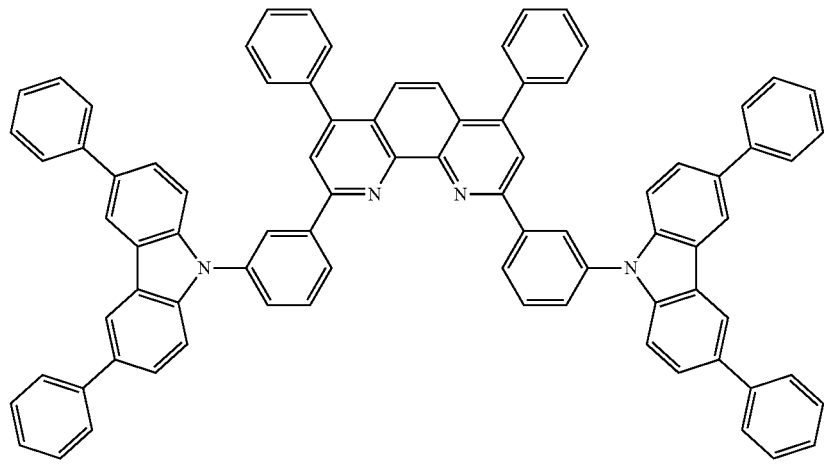

B-1

Compound B-1 had a Tg of about 220° C. The solubility in toluene was 24.7 mg/ml. The solubility in anisole was 23.3 mg/ml.

e) Compound A17 was made from the non-deuterated analog compound B-1.

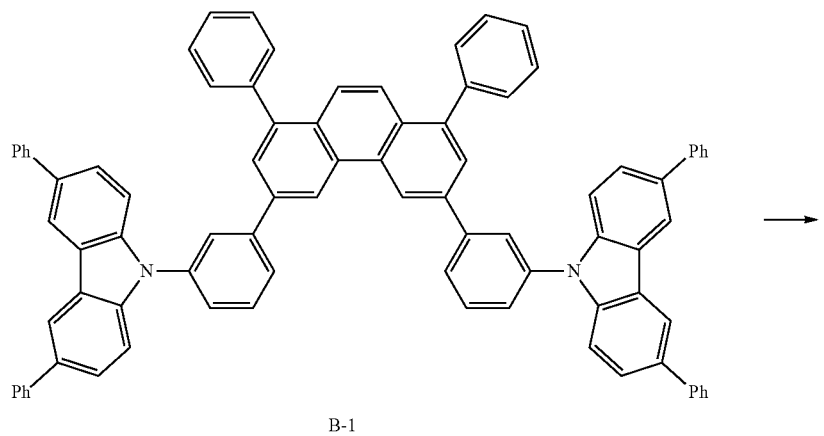

B-1

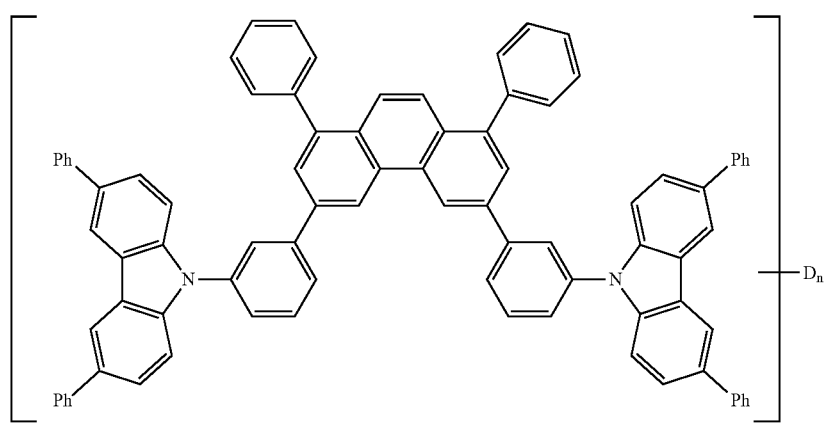

A17 n = 32-34

Under an atmosphere of nitrogen, the compound from step (d) above (1.925 g) was dissolved in $C_6D_6$ (200 mL) to which $CF_3OSO_2D$ (13.2 mL) was added dropwise. The reaction mixture was allowed to stir at room temperate overnight and then it was quenched with saturated $Na_2CO_3/D_2O$. The organic layer was isolated and dried over $MgSO_4$. The product was purified using silica chromatography ($CH_2Cl_2$:hexane) to yield 1.70 g of material. The NMR spectrum of the isolated material confirmed the structure as A17 with 32-34 D replacing H.

Compound A17 had a Tg of about 220° C. The solubility in toluene was 24.7 mg/ml. The solubility in anisole was 23.3 mg/ml.

Example 3

This example illustrates the preparation of a non-deuterated second host compound, Compound B-2.

a. Preparation of 3-Bromochrysene

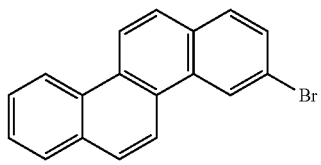 [SMILES: Brc1ccc2ccc3c4ccccc4ccc3c2c1]

(i) Preparation of 1-(4-bromostyryl)naphthalenes

An oven-dried two-liter four-neck round-bottom flask was equipped with a magnetic stir bar, addition funnel, thermometer adapter and nitrogen inlet and charged (1-napthylmethyl) triphenylphosphonium chloride (49.87 g, 113.6 mmol) and dry THF (970 ml). The slurry was cooled to −5° C. and n-BuLi (50 ml, 125 mmol, 2.5 M solution) was added via addition funnel over the period of 25 min. Residual n-BuLi was washed out of the addition funnel with 10 mL of THF. A very dark red solution formed and was left to stir for 15 min. Reaction mixture was then cooled to −75° C. and 4-bromobenzaldehyde (21.0 g, 113.6 mmol) dissolved in dry THF (ca. 75 ml) was added dropwise over 30 min, keeping the temp at −75° C. Residual aldehyde was washed out of the addition funnel with 20 mL of THF. Reaction mixture was left in the cold bath to gradually warm up to rt while stirring overnight. Next day, reaction was quenched with water (30 ml) and volatiles were removed on the rotavap. Residue was stirred in 500 ml of hexane and then filtered. Solids were washed with hexane. Filtrate was concentrated to give crude product which was purified by column chromatography (0-100% $CH_2Cl_2$ in hexanes). Yield 17.7 g (50%). Structure was confirmed by $^1$H NMR spectroscopy.

(ii) Preparation of 3-bromochrysene 1-(4-Bromostyryl)naphthalenes (5.0 g, 16.2 mmol) were dissolved in dry toluene (1 l) in a one-liter photochemical vessel, equipped with nitrogen inlet and a stir bar. A bottle of dry propylene oxide was cooled in ice-water before 100 ml of the epoxide was withdrawn with a syringe and added to the reaction mixture. Iodine (4.2 g, 16.5 mmol) was added last. Condenser was attached on top of the photochemical vessel and halogen lamp (Hanovia, 450 W) was turned on. Reaction was stopped by turning off the lamp when no more iodine was left in the reaction mixture, as evidenced by the disappearance of its color. The reaction was complete in two hours. Toluene and excess propylene oxide were removed under reduced pressure to yield a dark yellow solid. Crude product was washed with diethyl ether to give 3.4 g (68%) of 3-bromochrysene as an off-white solid. Structure was confirmed by $^1$H NMR spectroscopy.

b. Preparation of N-([1,1¹-biphenyl]-4-yl)-[1,1':3',1''-terphenyl]-4-amine

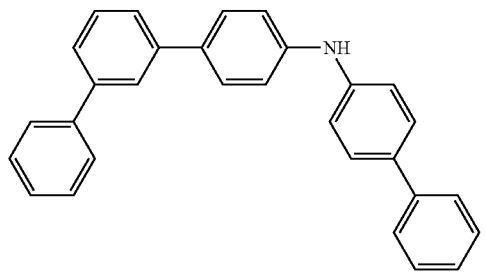 [SMILES: c1ccc(-c2ccc(Nc3ccc(-c4cccc(-c5ccccc5)c4)cc3)cc2)cc1]

In a drybox, 4-aminobiphenyl (0.542 g) and 4-bromo-1,1': 3',1''-terphenyl (0.89 g) were combined in a round-bottom flask and dissolved in 10 ml of dry toluene. Tris(tert-butyl) phosphine (0.022 g, 0.11 mmol) and tris(dibenzylideneacetone) dipalladium(0) (0.05 g, 0.055 mmol) were dissolved in 10 ml of dry toluene and stirred for 5 minutes. The catalyst solution was added to the reaction mixture, stirred for 2 minutes and was followed by sodium tert-butoxide (0.32 g, 3.3 mmol). Flask was capped and left to stir in the drybox overnight at room temperature. Next day, reaction mixture was taken out of the box and filtered through a one-inch plug of silica gel topped with celite, washing with 500 ml of dichloromethane. Removal of volatiles under reduced pressure gave a yellow solid. Crude product was purified by trituration with diethyl ether to give 0.85 g (73%) of a white solid. Structure was confirmed by $^1$H NMR spectroscopy.

c. Preparation of Compound B-2

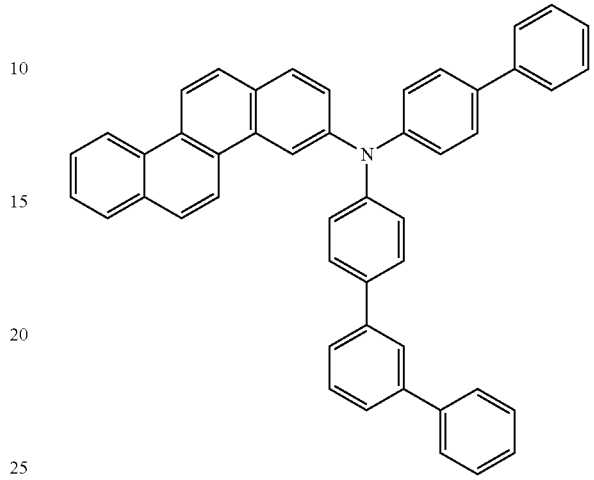

In a drybox, N-([1,1'-biphenyl]-4-yl)-[1,1':3',1''-terphenyl]-4-amine (2.02 mmol) and 3-bromochrysene (1.85 mmol) were combined in a thick-walled glass tube and dissolved in 20 ml of dry toluene. Tris(tert-butyl)phosphine (7.5 mg, 0.037 mmol) and tris(dibenzylideneacetone) dipalladium(0) (17 mg, 0.019 mmol) were dissolved in 10 ml of dry toluene and stirred for 10 minutes. The catalyst solution was added to the reaction mixture, stirred for 5 minutes and followed by sodium tert-butoxide (0.194 g, 2.02 mmol) and 20 ml of dry toluene. After another 10 minutes, the reaction flask was brought out of the drybox and placed into an 80° C. bath to stir overnight.

Next day, reaction mixture was cooled to room temperature and filtered through a three-inch plug of silica gel and topped with half an inch of Celite, washing with 400 ml of chloroform. Removal of volatiles under reduced pressure gave a yellow solid. Crude product was purified by column chromatography with chloroform in hexane. Yield 1.05 g (87.5%) of a white solid. Identity and purity of the product were established by $^1$H NMR, mass spectrometry and liquid chromatography.

Compound B-2 had a Tg of about 216° C. The solubility in toluene was 22.8 mg/ml. The solubility in anisole was 22.2 mg/ml.

Examples 4-6 and Comparative Examples A-C

These examples demonstrate the fabrication and performance of OLED devices.

The devices had the following structure on a glass substrate:

Indium Tin Oxide (ITO): 50 nm hole injection layer=HIJ-1 (50 nm), which is an aqueous dispersion of an electrically conductive polymer and a polymeric fluorinated sulfonic acid. Such materials have been described in, for example, published U.S. patent applications US 2004/0102577, US 2004/0127637, US 2005/0205860, and published PCT application WO 2009/018009.

hole transport layer=HT-1 (20 nm), which is an triarylamine-containing copolymer. Such materials have been described in, for example, published PCT application WO 2009/067419.

electroluminescent layer is shown in Table 1. In all cases, the dopant was D7.

electron transport layer=Compound B-1 (10 nm)

electron injection layer/cathode=CsF/Al (0.7/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a solution of a hole transport material, and then heated to remove solvent. After cooling the substrates were spin-coated with solution of the electroactive layer materials in toluene, and heated to remove solvent. The substrates were masked and placed in a vacuum chamber. The electron transport layer was deposited by thermal evaporation, followed by a layer of CsF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The results are given in Table 2.

TABLE 1

| | Electroluminescent Layer | | | |
|---|---|---|---|---|
| Example | First Host | Second Host | Weight Ratio $1^{st}$ Host:$2^{nd}$ Host:Dopant | Thickness (nm) |
| Ex. 4 | A1 | B-1 | 67:25:8 | 73 |
| Comp. A | B-2 | B-1 | 67:25:8 | 79 |
| Ex. 5 | A1 | B-1 | 67:25:8 | 70 |
| Comp. B | B-2 | B-1 | 67:25:8 | 70 |
| Ex. 6 | A17 | B-2 | 25:67:8 | 76 |
| Comp. C | B-1 | B-2 | 25:67:8 | 77 |

TABLE 2

| | Device Performance | | | | | | | |
|---|---|---|---|---|---|---|---|---|
| Ex. | CIE (x, y) | Voltage (V) | C.E. (cd/A) | E.Q.E. (%) | P.E. (lm/W) | Lifetest current density (mA/cm2) | Lifetest Luminance (nits) | Raw T50 (h) | Projected Lifetime T50 @1000 nits |
| 4 | 0.680, 0.318 | 5.6 | 13.8 | 17.2 | 7.7 | 123 | 8366 | 2450 | 112,119 |
| A | 0.680, 0.318 | 5.9 | 13.6 | 17.1 | 7.3 | 129 | 8698 | 1130 | 55,464 |
| 5 | 0.680, 0.318 | 5.8 | 13.0 | 16.9 | 7.0 | 127 | 8300 | 3000 | 135,341 |
| B | 0.680, 0.318 | 5.8 | 12.3 | 15.8 | 6.7 | 125 | 7692 | 1442 | 56,736 |
| 6 | 0.681, 0.317 | 5.8 | 12.7 | 16.6 | 6.9 | 125 | 8222 | 1741 | 77,231 |
| C | 0.681, 0.317 | 6.0 | 12.8 | 17.2 | 6.7 | 125 | 8055 | 1350 | 57,707 |

* All data @ 1000 nits, C.E. = current efficiency; CIEx and CIEy are the x and y color coordinates according to the C.I.E. chromaticity scale (Commission Internationale de L'Eclairage, 1931). E.Q.E is the external quantum efficiency; P.E. is the power efficiency. RawT50 is the time in hours for a device to reach one-half the initial luminance at the lifetest luminance given. Projected T50 is the projected lifetime at 1000 nits using an acceleration factor of 1.8.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An electroactive composition comprising: a deuterated first host material and an electroluminescent dopant material, wherein the first host is a compound having formula II:

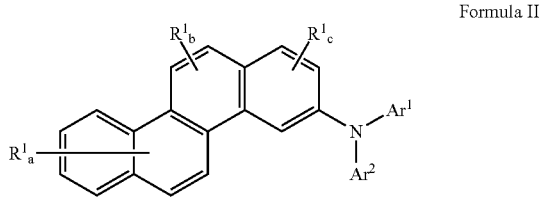

Formula II

R¹ is the same or different at each occurrence and is selected from the group consisting of D, alkoxy, silyl, and siloxane, or adjacent R¹ groups may be joined together to from a 5- or 6-membered aliphatic ring, Ar¹ and Ar² are the same or different and are aryl groups, a is an integer from 0 to 6;

b is an integer from 0 to 2; and c is an integer from 0 to 3, wherein the compound is deuterated;

and wherein the dopant material is a cyclometalated complex of Ir.

2. The composition of claim 1, further comprising (c) a second host material.

3. The composition of claim 2, wherein the second host material is selected from the group consisting of phenanthrolines, quinoxalines, phenylpyridines, benzodifurans, difuranobenzenes, indolocarbazoles, benzimidazoles, triazolopyridines, diheteroarylphenyls, metal quinolinate complexes, substituted derivatives thereof, deuterated analogs thereof, and combinations thereof.

4. The composition of claim 2, wherein the weight ratio of the first host material to the second host material is in the range of 99:1 to 1.5:1.

5. The composition of claim 2, wherein the first host and the second host each have a solubility in toluene of at least 0.6 wt %.

6. An organic light-emitting device comprising two electrical contact layers with an organic electroactive layer therebetween, wherein the electroactive layer comprises; a deuterated first host material and an electroluminescent dopant material, wherein the first host is a compound having Formula II:

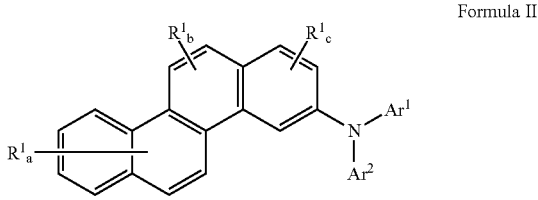

Formula II where:

R¹ is the same or different at each occurrence and is selected from the group consisting of D, alkoxy, silyl, and siloxane, or adjacent R¹ groups may be joined together to from a 5- or 6-membered aliphatic ring, Ar¹ and Ar² are the same or different and are aryl groups, a is an integer from 0 to 6;

b is an integer from 0 to 2; and c is an integer from 0 to 3, wherein the compound is deuterated;

and wherein the dopant material is a cyclometalated complex of Ir.

7. The device of claim 6, wherein Ar1 and Ar2 are independently selected from the group consisting of phenyl, biphenyl, terphenyl, quarterphenyl, naphthyl, phenanthryl, naphthylphenyl, and phenanthrylphenyl.

8. The device of claim 6, wherein at least one of Ar1 and Ar2 has at least one substituent selected from the group consisting of alkyl groups, alkoxy groups, and silyl groups.

9. The device of claim 6, wherein the electroactive layer futher comprises a second host material selected from the group consisting of phenanthrolines, quinoxalines, phenylpyridines, benzodifurans, difuranobenzenes, indolocarbazoles, benzimidazoles, triazolopyridines, diheteroarylphenyls, metal quinolinate complexes, substituted derivatives thereof, deuterated analogs thereof, and combinations thereof.

* * * * *